United States Patent
Bhat et al.

(10) Patent No.: US 11,569,799 B2
(45) Date of Patent: Jan. 31, 2023

(54) TRUE SINGLE-PHASE CLOCK (TSPC) NAND-BASED RESET FLIP-FLOP

(71) Applicant: SAMSUNG ELECTRONICS CO., LTD., Suwon-si (KR)

(72) Inventors: Aroma Bhat, Bengaluru (IN); Arani Roy, Bengaluru (IN); Mitesh Goyal, Bengaluru (IN); Abhishek Ghosh, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/188,510

(22) Filed: Mar. 1, 2021

(65) Prior Publication Data

US 2022/0173725 A1  Jun. 2, 2022

(30) Foreign Application Priority Data

Nov. 30, 2020  (IN) .............................. 202041052095

(51) Int. Cl.
 *H03K 3/3562* (2006.01)
 *H03K 3/037* (2006.01)
(52) U.S. Cl.
 CPC ....... *H03K 3/0372* (2013.01); *H03K 3/35625* (2013.01)
(58) Field of Classification Search
 CPC . H03K 3/0372; H03K 3/3562; H03K 3/35625
 See application file for complete search history.

(56) References Cited

U.S. PATENT DOCUMENTS

| | | | | |
|---|---|---|---|---|
| 6,515,528 | B1* | 2/2003 | Tohsche | H03K 3/356113 327/218 |
| 11,239,830 | B2* | 2/2022 | Kuenemund | H03K 3/35625 |
| 11,362,648 | B2* | 6/2022 | Bhat | G01R 31/3177 |
| 2020/0106426 | A1* | 4/2020 | Vadi | H03K 3/012 |
| 2021/0409009 | A1* | 12/2021 | Kang | G01R 31/3177 |

FOREIGN PATENT DOCUMENTS

| | | |
|---|---|---|
| CN | 102710259 | 8/2014 |
| CN | 102739239 | 11/2014 |
| CN | 105162438 | 10/2017 |

* cited by examiner

*Primary Examiner* — Patrick O Neill
(74) *Attorney, Agent, or Firm* — F. Chau & Associates, LLC

(57) ABSTRACT

A True Single-Phase Clock (TSPC) NAND-based reset flip-flop includes a reset functionality to perform a reset operation. The flip-flop with the reset functionality includes a master section and a slave section. The reset functionality is achieved using two transistors in the master section. The master section and the slave section operate using the TSPC. The master section and the slave section may include a plurality of NAND circuits and a NAND and NOR circuit for performing the reset operation. The master section outputs a plurality of internal signals on receiving a data input, a scan enable signal, a scan input signal, a reset control signal, and a clock signal. The slave section generates an output on receiving the plurality of internal signals received from the master section.

20 Claims, 10 Drawing Sheets

TRUE SINGLE-PHASE CLOCK (TSPC) NAND-BASED RESET FLIP-FLOP

CROSS-REFERENCE TO RELATED APPLICATIONS

This U.S. non-provisional patent application claims priority under 35 U.S.C. § 119 to Indian Patent Application No. 202041052095 filed on Nov. 30, 2020 in the Indian Patent Office, the disclosure of which is incorporated by reference herein in its entirety.

TECHNICAL FIELD

The present disclosure relates to the field of flip-flop circuits, and more particularly, to an area and power efficient True Single-Phase Clock (TSPC) NAND-based reset flip-flop circuit.

DISCUSSION OF RELATED ART

Flip-flop circuits are used in sequential logic circuits, standard cell libraries, and the like, to temporarily store binary data or to perform operations such as scan test operations, reset operations, set operations, or the like. Performance of flip-flop circuits may be analyzed in terms of parameters such as, but not limited to, System on Chip (SoC) area, delay, power, and the like. Optimization of such parameters may enhance the performance and block level gain in a flip-flop circuit.

SUMMARY

Accordingly, exemplary embodiments described herein provide a True Single-Phase Clock (TSPC) NAND-based reset flip-flop or latch.

An exemplary embodiment flip-flop includes a master section coupled to the TSPC and a slave section coupled to the master section. The master section is configured to output a plurality of internal signals, on receiving a data input, a scan enable signal, a scan input signal, a reset control signal, and a clock signal. The slave section is configured to generate an output on receiving the plurality of internal signals from the master section.

An exemplary embodiment flip-flop circuit includes a master section coupled to a True Single-Phase Clock (TSPC) and configured to output a plurality of internal signals, on receiving a data input, a scan enable signal, a scan input signal, and a clock signal; and a slave section coupled to the master section and configured to generate an output on receiving the plurality of internal signals from the master section, wherein the flip-flop includes a set functionality.

An exemplary embodiment TSPC NAND-based reset flip-flop, as well as related methods and systems, may enable the flip-flop to perform reset operations using only two transistors, which, in turn, may have relatively low circuit area and/or power consumption.

An exemplary embodiment reset flip-flop circuit includes: a first reset transistor having a first connection terminal connected to a first power line, a control terminal connected to a reset line, and a second connection terminal; and a second reset transistor having a first connection terminal connected to the second connection terminal of the first reset transistor, a control terminal connected to the reset line, and a second connection terminal connected to a second power line.

These and other embodiments herein will be better appreciated and understood when considered in conjunction with the following description and the accompanying drawings. It should be understood, however, that the following descriptions, while indicating exemplary embodiments and numerous specific details thereof, are given by way of illustration and not of limitation. Many changes and modifications may be made within the scope of the exemplary embodiments herein without departing from the spirit thereof, and the exemplary embodiments herein may include any or all such modifications.

BRIEF DESCRIPTION OF THE DRAWINGS

Embodiments herein are illustrated in the accompanying drawings, throughout which like reference letters may indicate corresponding parts in the various figures. The embodiments herein will be better understood from the following description with reference to the drawings, in which.

DETAILED DESCRIPTION

The exemplary embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The description herein is intended merely to facilitate an understanding of ways in which the exemplary embodiments herein can be practiced and to further enable those of skill in the art to practice the exemplary embodiments herein. Accordingly, this disclosure should not be construed as limiting the scope of the exemplary embodiments herein.

Embodiments herein disclose an area and power efficient True Single-Phase Clock (TSPC) NAND-based reset flip-flop, wherein reset functionality is achieved in the TSPC NAND-based reset flip-flop using only two transistors.

A flip-flop circuit with reset functionality may include a plurality of transistors. For example; four or more transistors might be used in a related art flip-flop circuit to add reset functionality, where the flip-flop may store data or perform scan test operations. Thus, adding the plurality of transistors in the related art flip-flop circuit may consume significant circuit area and/or power.

Figure 1A:
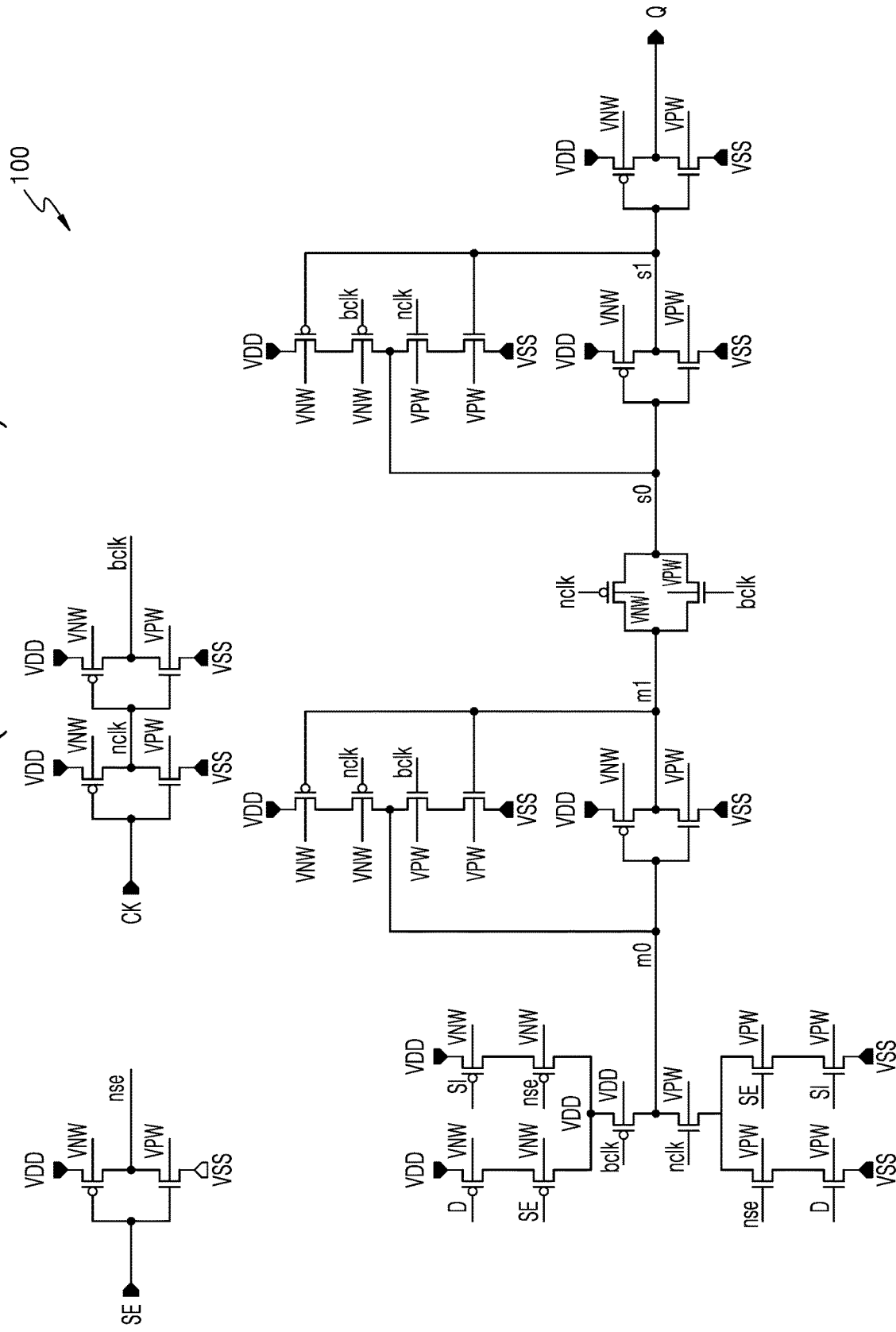
FIG. 1a is a schematic circuit diagram depicting a related art flip-flop.
Figure 1B:
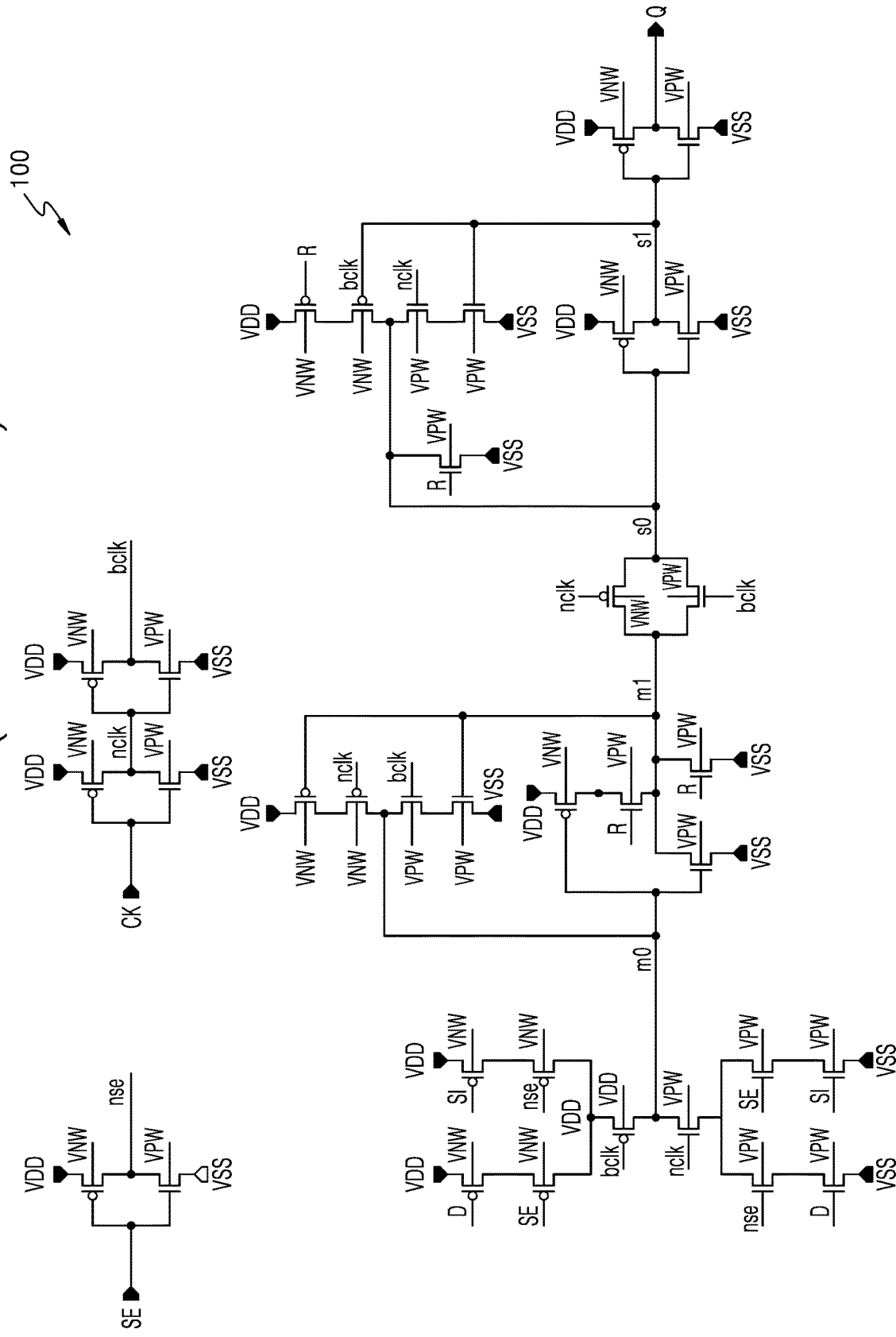
FIG. 1b is a schematic circuit diagram depicting a related art flip-flop including a reset functionality.

FIG. 1a is a depicts a related art flip-flop 100. As shown in FIG. 1a, the related art flip-flop 100 can be configured to perform data storage operations or scan test operations. The related art flip-flop 100 can also perform reset operations by including a reset functionality. The reset functionality can be achieved by implementing four additional transistors in the related art flip-flop 100 as depicted in FIG. 1b. However, adding such transistors in the related art flip-flop 100 to achieve the reset functionality may require greater surface area. Also, the related art flip-flop 100 may include a clock buffer, and a single stack structure for performing the reset operation, which may increase power consumption of the related art flip-flop 100.

Referring now to FIGS. 2a through 7, where similar reference indicia may denote corresponding features consistently throughout the figures, description will be made by way of example, but without limitation thereto.

Figure 2A:
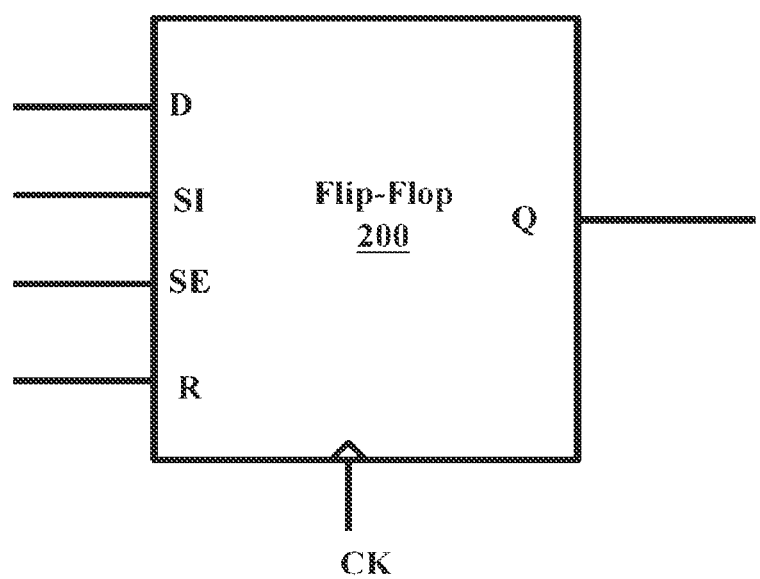
FIG. 2a is a schematic block diagram depicting a flip-flop according to an embodiment as disclosed herein.
Figure 2B:
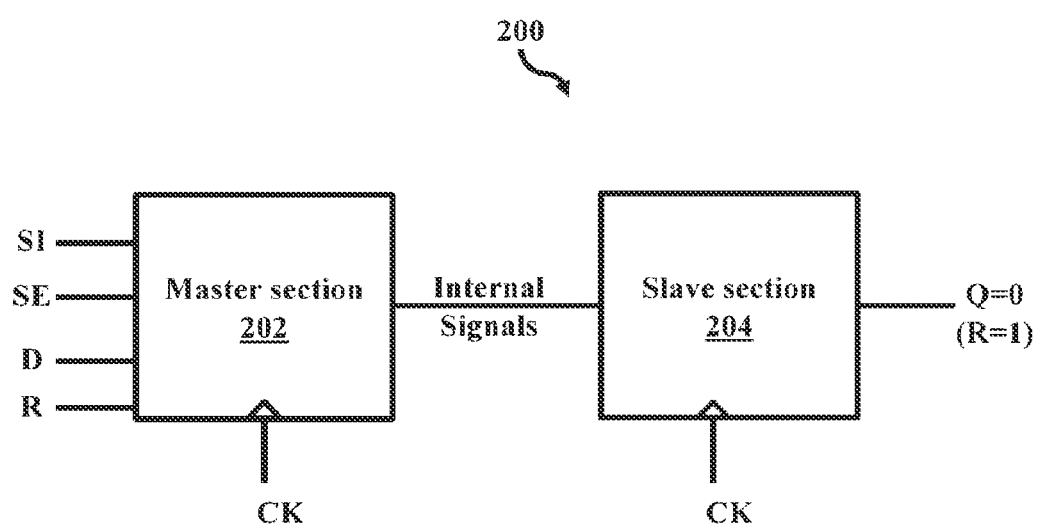
FIG. 2b is a schematic block diagram depicting a flip-flop including a reset functionality according to an embodiment as disclosed herein.

FIGS. 2a and 2b depict a flip-flop 200, according to embodiments as disclosed herein. The flip-flop 200 may be implemented in an integrated circuit of an electronic device. Examples of the electronic device, can be, but are not limited to, a mobile phone, a smartphone, a tablet, a phablet, a personal digital assistant (PDA), a laptop, a computer, a wearable computing device, a server, a vehicle infotainment device, an Internet of Things (IoT) device, or any other device which comprises at least one flip-flop 200. In an embodiment, the integrated circuit may be defined by at least one of, but is not limited to, a plurality of cells and/or standardized logic circuit blocks, sequential logic circuits, high performance application processors, high-performance arithmetic blocks, and the like. The plurality of cells may be designed using a cell library. The cell library includes characteristic information of the plurality of cells such as, but not limited to, a name of a cell, a dimension, a gate width, a pin, delay characteristic, a leakage current, a threshold voltage, a function, and the like. The cell library set may also include basic cells such as, but not limited to, an AND gate, an OR gate, a NOR gate, an inverter, and the like. The cell library set may also include complex cells such as, but not limited to, an OR/AND/INVERTER (OAI) gate, an AND/OR/INVERTER (AOI) gate, and the like.

As depicted in the example in FIG. 2a, the flip-flop 200 referred herein can be a reset flip-flop. In an embodiment herein, the flip-flop 200 can be configured to provide an output Q by performing a normal mode of operation, on receiving a data input D, a scan input signal SI, a scan enable signal SE, a reset control signal R, and a clock signal CK. The flip-flop 200 performs the normal mode of operation when the reset control signal R is at a logic low level (R=0).

In the normal mode of operation, the flip-flop 200 provides the output Q equal to the data input or the scan input signal. In the normal mode of operation, the flip-flop 200 provides the output Q, by storing or latching the data input D or performing scan test operations by selecting the scan input signal SI, based on the scan enable signal SE and the clock signal CK. The scan test operations include setting a certain number of flip-flops present in a scan chain through the scan enable signal SE, and the scan input signal SI, and implementing certain test patterns to check its correctness at outputs of the flip-flops in the scan chain.

In an embodiment herein, the flip-flop 200 can be configured to provide an output Q by performing a reset operation, on receiving a data input D, a scan input signal SI, a scan enable signal SE, a reset control signal R, and a clock signal CK. The flip-flop 200 performs the reset operation when the reset control signal R is at a logic high level (R=1). The flip-flop 200 performs the reset operation by providing the output Q=0. In the reset operation, the flip-flop 200 resets back to its original state.

The flip-flop 200 includes a master section 202 and a slave section 204. In an embodiment, the master section 202 and the slave section 204 of the flip-flop 200 may be operated using a True-Single-Phase-Clock (TSPC) instead of clock buffers. The TSPC may include a Single-Phase of the clock that can be either a clock signal or an inverted clock signal. In an embodiment, the master section 202 may include a plurality of NAND stages and/or NAND sub-sections and/or circuits for performing at least one intended function. In an embodiment, the master section 202 may include two transistors for performing the reset operation. Performing the reset operation using the TSPC, the NAND stages, and the two transistors may decrease area and power consumption of the flip-flop 200. In an embodiment, the flip-flop 200 may be referred as a TSPC NAND-based flip-flop 200, as the master and slave sections (202, 204) of the flip-flop 200 include the NAND stages and operate using the TSPC.

The master section 202 can be configured to receive the data input D, the scan input signal SI, the scan enable signal SE, the reset control signal R, and the clock signal, and to output internal signals and/or intermediary signals to the slave section 204 based on the received signals. The slave section 204 can be configured to provide the output Q based on the internal signals received from the master section 202. The output Q corresponds to a logic level '0' when the reset control signal R=1.

Figure 3A:
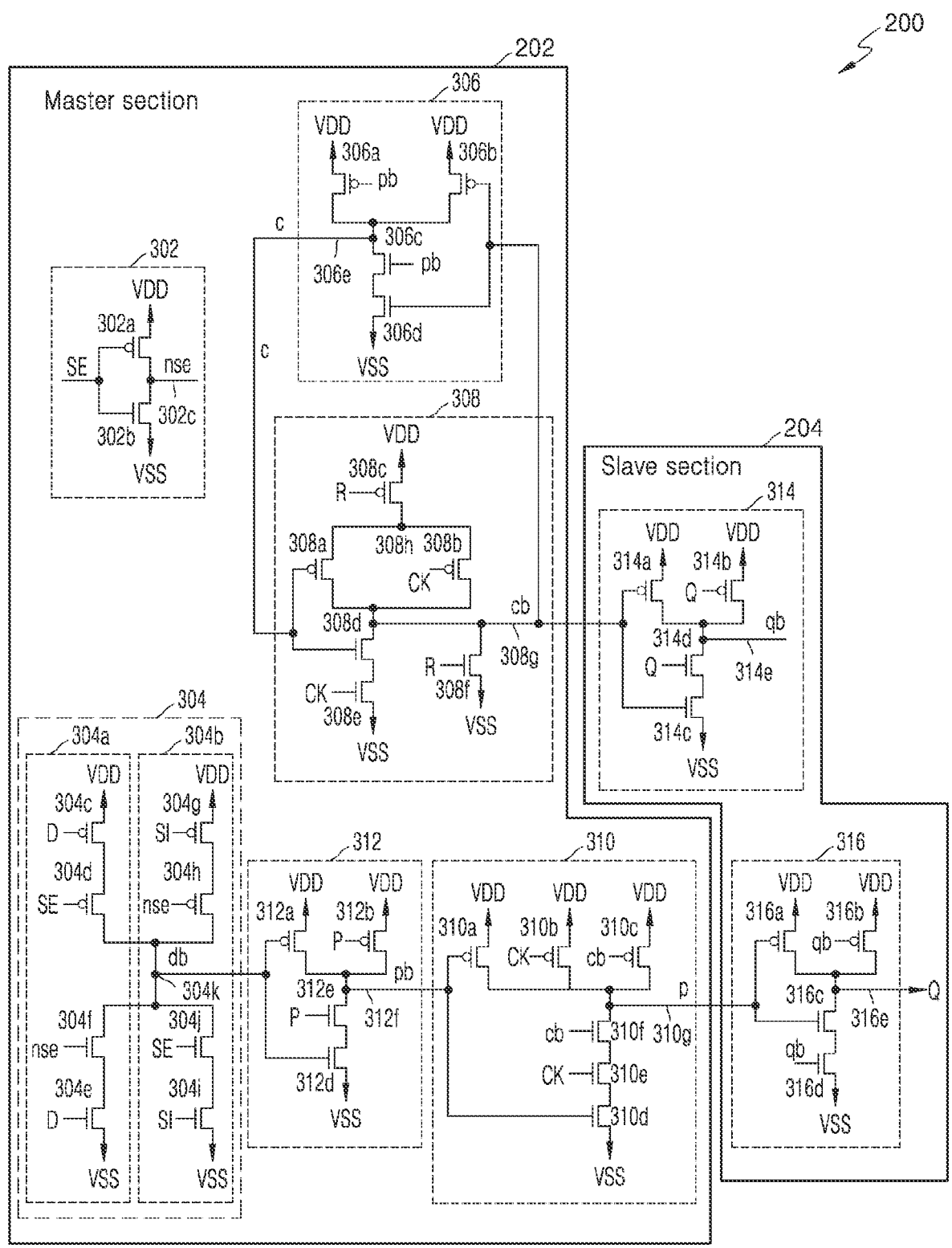
FIG. 3a is a schematic circuit diagram depicting a flip-flop including a reset functionality to perform the reset operation, according to an embodiment as disclosed herein.

FIG. 3a depicts the flip-flop 200 including a reset functionality to perform the reset operation, according to embodiments as disclosed herein. The flip-flop 200 includes the master section 202, and the slave section 204.

As depicted in FIG. 3a, the master section 202 includes a first inverter circuit 302, a master stage multiplexer (MUX) 304, a first master stage or sub-section 306, a second master stage or sub-section 308, a third master stage or sub-section 310, and a fourth master stage or sub-section 312 for performing the reset operation. The first master stage 306, the third master stage 310, and the fourth master stage 312 can be NAND circuits or stages. In an embodiment, the second master stage 308 can be a combination of NAND and NOR circuit. The master section 202 is depicted in FIG. 3b.

Figure 3B:
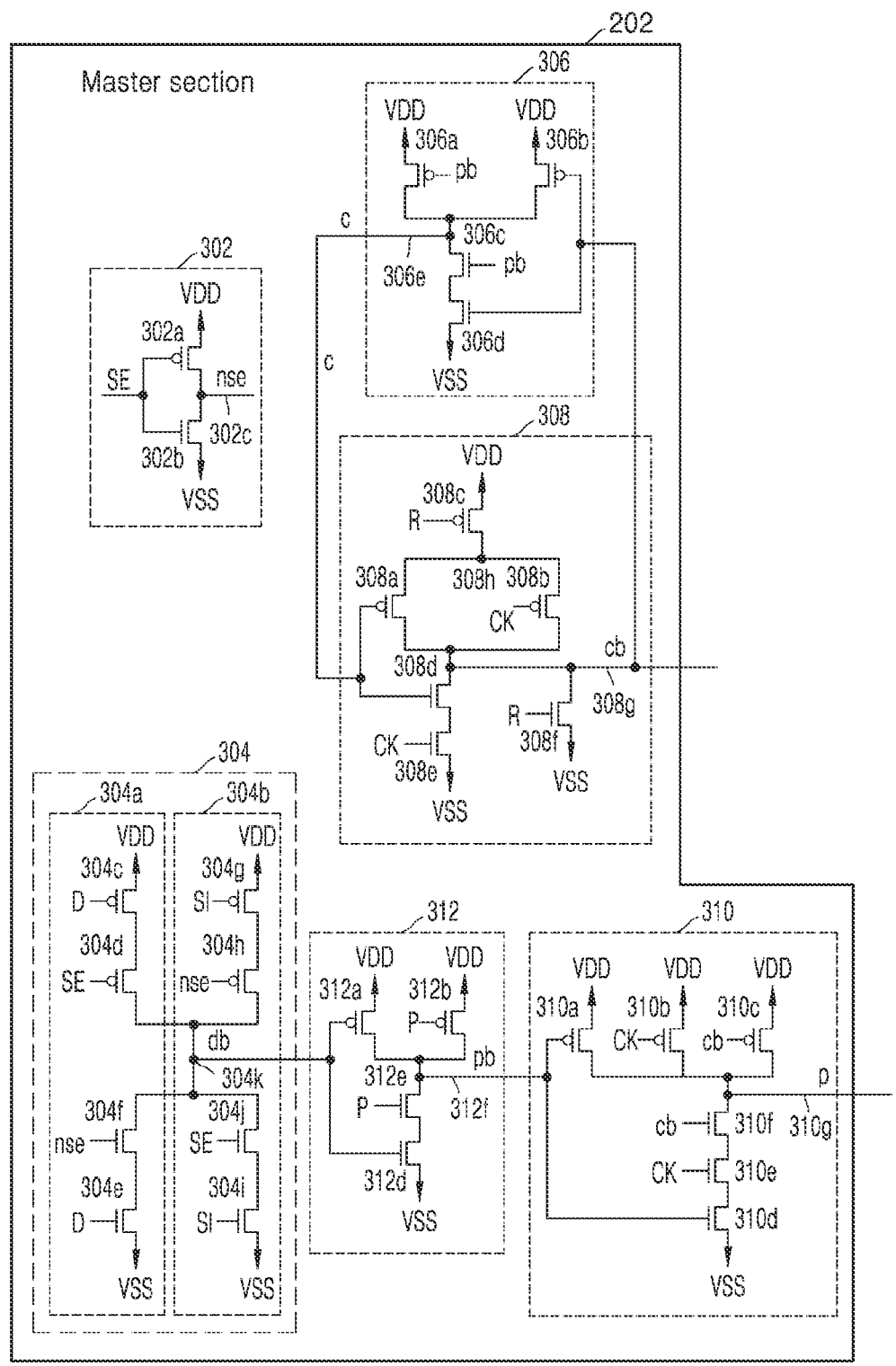
FIG. 3b is a schematic circuit diagram depicting a master section of a flip-flop, according to an embodiment as disclosed herein.

As depicted in FIGS. 3a, and 3b, the first inverter circuit 302 can be configured to output an inversion of the scan enable signal nse on a first inverter circuit output node 302c, on receiving the scan enable signal SE. The first inverter circuit 302 performs an invert operation on the scan enable signal SE to output the inversion of the scan enable signal nse on the first inverter circuit output node 302c. The first inverter circuit 302 includes a first P-type Metal Oxide Semiconductor (PMOS) transistor 302a, and a first N-type Metal Oxide Semiconductor (NMOS) transistor 302b to output the inversion of the scan enable signal nse on the first inverter circuit output node 302c. The first PMOS transistor 302a can be connected to a VDD voltage (high power supply voltage), the scan enable signal SE, and the first inverter circuit output node 302c. The first PMOS transistor 302a includes a source connected to the VDD voltage, a gate connected to the scan enable signal SE, and a drain connected to the first inverter circuit output node 302c. The first NMOS transistor 302b can be connected to a VSS voltage (low power supply voltage or grounded), the scan enable signal SE, and the first inverter circuit output node 302c. The first NMOS transistor 302b includes a source connected to the VSS voltage, a gate connected to the scan enable signal SE, and the drain connected to the first inverter circuit output node 302c. In an embodiment, when the scan enable signal SE=0, the first PMOS transistor 302a turns ON and outputs the inversion of the scan enable signal nse=1 on the first inverter circuit output node 302c. In an embodiment, when the scan enable signal SE=1, the first NMOS transistor 302b turns ON and outputs the inversion of the scan enable signal nse=0 on the first inverter circuit output node 302c.

The master stage MUX 304 can be configured to output a MUX internal signal db on a master stage MUX output node 304k, on receiving the data input D, the scan enable signal SE, the scan input signal SI, and the inversion of the scan enable signal nse. The master stage MUX 304 includes a first tri-state inverter 304a and a second tri-state inverter 304b to output the MUX internal signal db on the master stage MUX output node 304k.

The first tri-state inverter 304a can be configured to output an inversion of the data input D as the MUX internal signal db on the master stage MUX output node 304k, based on the scan enable signal SE, and the inversion of the scan enable signal nse. When the scan enable signal SE=0, and the inversion of the scan enable signal nse=1, the first tri-state inverter 304a performs the invert operation on the data input D, and outputs the inversion of the data input D as the MUX internal signal db on the master stage MUX output node 304k. The first tri-state inverter 304a includes a second PMOS transistor 304c, a third PMOS transistor 304d, a second NMOS transistor 304e, and a third NMOS transistor 304f to output the inversion of the data input D as the MUX internal signal db on the master stage MUX output node 304k. The second PMOS transistor 304c can be connected to the VDD voltage, the data input D, and the third PMOS transistor 304d. The third PMOS transistor 304d can be connected to the scan enable signal SE, and the master stage MUX output node 304k. The second PMOS transistor 304c includes a source connected to the VDD voltage, a gate connected to the data input D, and a drain connected to a source of the third PMOS transistor 304d. The third PMOS transistor 304d includes a gate connected to the scan enable signal SE, and a drain connected to the master stage MUX output node 304k. The second NMOS transistor 304e can be connected to the VSS voltage, the data input D, and the third NMOS transistor 304f. The third NMOS transistor 304f can be connected to the inversion of the scan enable signal nse, which has been outputted on the inverter circuit output node 302c, and the master stage MUX output node 304k. The second NMOS transistor 304e includes a source connected to the VSS voltage, a gate connected to the data input D, and a drain connected to a source of the third NMOS transistor 304f. The third NMOS transistor 304f includes a gate connected to the inversion of the scan enable signal nse, and a drain connected to the master stage MUX output node 304k.

The second tri-state inverter 304b can be configured to output an inversion of the scan input signal SI as the MUX internal signal db on the master stage MUX output node 304k, based on the scan enable signal SE, and the inversion of the scan enable signal nse. When the scan enable signal SE=1, and the inversion of the scan enable signal SE=0, the second tri-state inverter 304b performs the invert operation on the scan input signal SI, and outputs the inversion of the scan input signal SI as the MUX internal signal db on the master stage MUX output node 304k. The second tri-state inverter 304b includes a fourth PMOS transistor 304g, a fifth PMOS transistor 304h, a fourth NMOS transistor 304i, and a fifth NMOS transistor 304j to output the inversion of the scan input signal as the MUX internal signal db on the master stage MUX output node 304k. The fourth PMOS transistor 304g can be connected to the VDD voltage, the scan input signal SI, and the fifth PMOS transistor 304h. The fifth PMOS transistor 304h can be connected to the inversion of the scan enable signal nse outputted on the first inverter circuit output node 302c, and the master stage MUX output node 304k. The fourth PMOS transistor 304g includes a source connected to the VDD voltage, a gate connected to the scan input signal SI, and a drain connected to a source of the fifth PMOS transistor 304h. The fifth PMOS transistor 304h includes a gate connected to the inversion of the scan enable signal nse, and a drain connected to the master stage MUX output node 304k. The fourth NMOS transistor 304i can be connected to the VSS voltage, the scan input signal SI, and the fifth NMOS transistor 304j. The fifth NMOS transistor 304j can be connected to the scan enable signal SE, and the master stage MUX output node 304k. The fourth NMOS transistor 304i includes a source connected to the VSS voltage, a gate connected to the scan input signal SI, and a drain connected to a source of the fifth NMOS transistor 304j. The fifth NMOS transistor 304j includes a gate connected to the scan enable signal SE, and a drain connected to the master stage MUX output node 304k.

The first master stage 306 can be configured to output a first master stage internal signal c on a first master stage output node 306e, on receiving a second master stage internal signal cb from the second master stage 308, and a fourth master stage internal signal pb from the fourth master stage 312. The first master stage 306 performs a NAND operation on the second master stage internal signal cb, and the fourth master stage internal signal pb to output the first master stage internal signal c on the first master stage output node 306e. The first master stage 306 includes a sixth PMOS transistor 306a, a seventh PMOS transistor 306b, a sixth NMOS transistor 306c, and a seventh NMOS transistor 306d to output the first master stage internal signal c on the first master stage output node 306e.

The sixth PMOS transistor 306a can be connected to the VDD voltage, the fourth master stage internal signal pb outputted on a fourth master stage output node 312f, and the first master stage output node 306e. The seventh PMOS transistor 306b can be connected to the VDD voltage, the second master stage internal signal cb outputted on a second master stage output node 308g, and the first master stage output node 306e. The sixth PMOS transistor 306a includes a source connected to the VDD voltage, a gate connected to the fourth master stage internal signal pb, and a drain connected to the first master stage output node 306e. The seventh PMOS transistor 306b includes a source connected to the VDD voltage, a gate connected to the second master stage internal signal cb, and a drain connected to the first master stage output node 306e.

The sixth NMOS transistor 306c can be connected to the seventh NMOS transistor 306d, the fourth master stage internal signal pb outputted on the fourth master stage output node 312f, and the first master stage output node 306e. The seventh NMOS transistor 306d can be connected to the VSS voltage, and the second master stage internal signal cb outputted on the second master stage output node 308g. The sixth NMOS transistor 306c includes a source connected to a drain of the seventh NMOS transistor 306d, a gate connected to the fourth master stage internal signal pb, and a drain connected to the first master stage output node 306e. The seventh NMOS transistor 306d includes a source connected to the VSS voltage, and a gate connected to the second master stage internal signal cb.

The second master stage 308 can be configured to output the second master stage internal signal cb on the second master stage output node 308g, on receiving the first master stage internal signal c from the first master stage 306, the clock signal CK, and the reset control signal R. In an embodiment, the second master stage 308 performs a NAND and NOR operation on the first master stage internal signal c, the clock signal CK, and the reset control signal R to output the second master stage internal signal cb on the second master stage output node 308g. The second master stage internal signal cb may be further provided to the slave section 204. The second master stage 308 includes an eighth PMOS transistor 308a, a ninth PMOS transistor 308b, a tenth PMOS transistor 308c, an eighth NMOS transistor 308d, a ninth NMOS transistor 308e, and a tenth NMOS transistor 308f. In an embodiment, the tenth PMOS and NMOS transistors (308c, 308f) may be implemented in the second master stage 308 for achieving reset functionality to perform the reset operation.

The eighth PMOS transistor 308a can be connected to a first conjunction node 308h, the first master stage internal signal c outputted on the first master stage output node 306e, and the second master stage output node 308g. The ninth PMOS transistor 308b can be connected to the first conjunction node 308h, the clock signal CK, and the second master stage output node 308g. The tenth PMOS transistor 308c can be connected to the VDD voltage, the reset control signal R, and the first conjunction node 308h. The eighth PMOS transistor 308a includes a source connected to the first conjunction node 308h, a gate connected to the first master stage internal signal c, and a drain connected to the second master stage output node 308g. The ninth PMOS transistor 308b includes a source connected the first conjunction node 308h, a gate connected to the clock signal CK, and a drain connected to the second master stage output node 308g. The tenth PMOS transistor 308c includes a source connected to the VDD voltage, a gate connected to the reset control signal R, and a drain connected to the first conjunction node 308h.

The eighth NMOS transistor 308d can be connected to the second master stage output node 308g, the first master stage internal signal c outputted on the first master stage output node 306e, and the ninth NMOS transistor 308e. The ninth NMOS transistor 308e can be connected to the VSS voltage, and the clock signal CK. The tenth NMOS transistor 308f can be connected to the VSS voltage, the reset control signal, and the second master stage output node 308g. The eighth NMOS transistor 308d includes a source connected to a drain of the ninth NMOS transistor 308e, a gate connected to the first master stage internal signal c, and a drain connected to the second master stage output node 308g. The ninth NMOS transistor 308e includes a source connected to the VSS voltage, and a gate connected to the clock signal CK. The tenth NMOS transistor 308f includes a source connected to the VSS voltage, a gate connected to the reset control signal R, and a drain connected to the second master stage output node 308g.

The third master stage 310 can be configured to output a third master stage internal signal p on a third master stage output node 310g, on receiving the second master stage internal signal cb from the second master stage 310, the clock signal CK, and the fourth master stage internal signal pb from the fourth master stage 312. The third master stage 310 can be a triple stack structure, which performs the NAND operation on the second master stage internal signal cb, the clock signal CK, and the fourth master stage internal signal pb to output the third master stage internal signal p on the third master stage output node 310g. The third master stage internal signal p may be further provided to the slave section 204. The third master stage 310 includes an eleventh PMOS transistor 310a, a twelfth PMOS transistor 310b, a thirteenth PMOS transistor 310c, an eleventh NMOS transistor 310d, a twelfth NMOS transistor 310e, and a thirteenth NMOS transistor 310f to output the third master stage internal signal p on the third master stage output node 310g.

The eleventh PMOS transistor 310a can be connected to the VDD voltage, the fourth master stage internal signal pb outputted on the fourth master stage output node 312f, and the third master stage output node 310g. The twelfth PMOS transistor 310b can be connected to the VDD voltage, the clock signal CK, and the third master stage output node 310g. The thirteenth PMOS transistor 310c can be connected to the VDD voltage, the second master stage internal signal cb outputted on the second master stage output node 308g, and the third master stage output node 310g. The eleventh PMOS transistor 310a includes a source connected to the VDD voltage, a gate connected to the fourth master stage internal signal pb, and a drain connected to the third master stage output node 310g. The twelfth PMOS transistor 310b includes a source connected to the VDD voltage, a gate connected to the clock signal CK, and a drain connected to the third master stage output node 310g. The thirteenth PMOS transistor 310c includes a source connected to the VDD voltage, a gate connected to the second master stage internal signal cb, and a drain connected to the third master stage output node 310g.

The eleventh NMOS transistor 310d can be connected to the VSS voltage, the fourth master stage internal signal pb outputted on the fourth master stage output node 312f, and the twelfth NMOS transistor 310e. The twelfth NMOS transistor 310e can be connected to the clock signal CK, and the thirteenth NMOS transistor 310f. The thirteenth NMOS transistor 310f can be connected to the second master stage internal signal cb outputted on the second master stage output node 308g, and the third master stage output node 310g. The eleventh NMOS transistor 310d includes a source connected to the VSS voltage, a gate connected to the fourth master stage internal signal pb, and a drain connected to a source of the twelfth NMOS transistor 310e. The twelfth NMOS transistor 310e includes a gate connected to the clock signal CK, and a drain connected to a source of the thirteenth NMOS transistor 310f. The thirteenth NMOS transistor 310f includes a gate connected to the second master stage internal signal cb, and a drain connected to the third master stage output node 310g.

The fourth master stage 312 can be configured to output the fourth master stage internal signal pb on the fourth master stage output node 312f, on receiving the third master stage internal signal p from the third master stage 310, and the MUX internal signal db from the master stage MUX 304. The fourth master stage 312 performs the NAND operation on the third master stage internal signal p, and the MUX internal signal db to output the fourth master stage internal signal pb on the fourth master stage output node 312f. The fourth master stage 312 includes a fourteenth PMOS transistor 312a, a fifteenth PMOS transistor 312b, a fourteenth NMOS transistor 312d, and a fifteenth NMOS transistor 312e to output the fourth master stage internal signal pb on the fourth master stage output node 312f.

The fourteenth PMOS transistor 312a can be connected to the VDD voltage, the MUX internal signal db outputted on the master stage MUX output node 304k, and the fourth master stage output node 312f. The fifteenth PMOS transistor 312b can be connected to the VDD voltage, the third master stage internal signal p outputted on the third master stage output node 310g, and the fourth master stage output node 312f. The fourteenth PMOS transistor 312a includes a source connected to the VDD voltage, a gate connected to the MUX internal signal db, and a drain connected to the fourth master stage output node 312f. The fifteenth PMOS transistor 312b includes a source connected to the VDD voltage, a gate connected to the third master stage internal signal p, and a drain connected to the fourth master stage output node 312f.

The fourteenth NMOS transistor 312d can be connected to the VSS voltage, the MUX internal signal db outputted on the master stage MUX output node 304k, and the fifteenth NMOS transistor 312e. The fifteenth NMOS transistor 312e can be connected to the third master stage internal signal p outputted on the third master stage output node 310g, and the fourth master stage output node 312f. The fourteenth NMOS transistor 312d includes a source connected to the VSS voltage, a gate connected to the MUX internal signal db, and a drain connected to a source of the fifteenth NMOS transistor 312e. The fifteenth NMOS transistor 312e includes a gate connected to the third master stage internal signal p, and a drain connected to the fourth master stage output node 312f.

In an example, names of the first, second, third, and fourth master stage internal signals c, cb, p, and pb respectively of the flip-flop 200 disclosed herein have been arbitrarily selected for the internal signals of the corresponding stages of the reset flip-flop 200. Additionally, the internal signals of the flip-flop 200 described herein are not inverses of each other in all operating modes.

The slave section 204 can be configured to generate the output Q, on receiving the second and third master stage internal signals cb, and p from the master stage 202. The slave section 204 includes a first slave stage or sub-section 314, and a second slave stage or sub-section 316 for generating the output Q. The first and second slave stages (314, 316) can be the NAND circuits or stages. The slave section 204 is individually depicted in FIG. 3c.

Figure 3C:
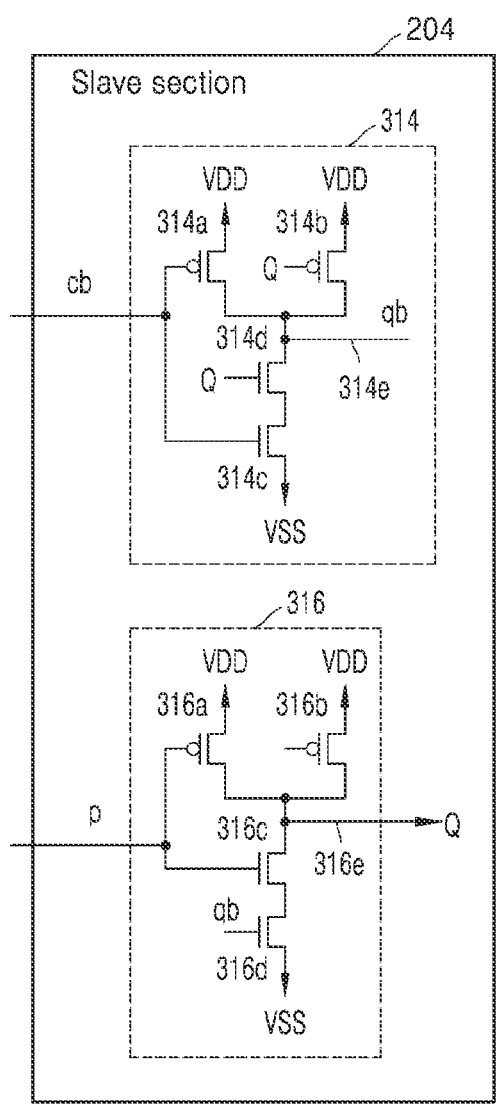
FIG. 3c is a schematic circuit diagram depicting a slave section of a flip-flop, according to an embodiment as disclosed herein.

As depicted in FIGS. 3a, and 3c, the first slave stage 314 can be configured to output the first slave stage signal qb on a first slave stage output node 314e, on receiving the second master stage internal signal cb from the second master stage 308 of the master section 202, and the output Q from the second slave stage 316. The first slave stage 314 performs the NAND operation on the second master stage internal signal cb, and the output Q to output the first slave stage signal qb on the first slave stage output node 314e. The first slave stage 314 includes a sixteenth PMOS transistor 314a, a seventeenth PMOS transistor 314b, a sixteenth NMOS transistor 314c, and a seventeenth NMOS transistor 314d to output the first slave stage signal qb on the first slave stage output node 314e.

The sixteenth PMOS transistor 314a can be connected to the VDD voltage, the second master stage internal signal cb outputted on the second master stage output node 308g, and the first slave stage output node 314e. The seventeenth PMOS transistor 314b can be connected to the VDD voltage, the output Q, and the first slave stage output node 314e. The sixteenth PMOS transistor 314a includes a source connected to the VDD voltage, a gate connected to the second master stage internal signal cb, and a drain connected to the first slave stage output node 314e. The seventeenth PMOS transistor 314b includes a source connected to the VDD voltage, a gate connected to the output Q, and a drain connected to the first slave stage output node 314e.

The sixteenth NMOS transistor 314c can be connected to the VSS voltage, the second master stage internal signal cb outputted on the second master stage output node 308g, and the seventeenth NMOS transistor 314d. The seventeenth NMOS transistor 314d can be connected to the output Q, and the first slave stage output node 314e. The sixteenth NMOS transistor 314c includes a source connected to the VSS voltage, a gate connected to the second master stage internal signal cb, and a drain connected to a source of the seventeenth NMOS transistor 314d. The seventeenth NMOS transistor 314d includes a gate connected to the output Q, and a drain connected to the first slave stage output node 314e.

The second slave stage 316 can be configured to generate the output Q on an output node 316e, on receiving the third master stage internal signal p from the third master stage 310 of the master section 202, and the first slave stage signal qb from the first slave stage 314. The second slave stage 316 performs the NAND operation on the third master stage internal signal p, and the first slave stage signal qb to generate the output Q on the output node 316e. The second slave stage 316 includes an eighteenth PMOS transistor 316a, a nineteenth PMOS transistor 316b, an eighteenth NMOS transistor 316c, and a nineteenth NMOS transistor 316d to generate the output Q on the output node 316e.

The eighteenth PMOS transistor 316a can be connected to the VDD voltage, the third master stage internal signal p outputted on the third master stage output node 310g, and the output node 316e. The nineteenth PMOS transistor 316b can be connected to the VDD voltage, the first slave stage signal qb outputted on the first slave stage output node 314e, and the output node 316e. The eighteenth PMOS transistor 316a includes a source connected to the VDD voltage, a gate connected to the third master stage internal signal p, and the drain connected to the output node 316e. The nineteenth PMOS transistor 316b includes a source connected to the VDD voltage, a gate connected to the first slave stage signal qb, and a drain connected to the output node 316e.

The eighteenth NMOS transistor 316c can be connected to the nineteenth NMOS transistor 316d, the third master stage internal signal p outputted on the third master stage output node 310g, and the output node 316e. The nineteenth NMOS transistor 316e can be connected to the VSS voltage, and the first slave stage signal qb outputted on the first slave stage output node 314e. The eighteenth NMOS transistor 316c includes a source connected to a drain of the nineteenth NMOS transistor 316d, a gate connected to the third master stage internal signal p, and a drain connected to the output node 316e. The nineteenth NMOS transistor 316e includes a source connected to the VSS voltage, and a gate connected to the first slave stage signal qb.

Figure 4:
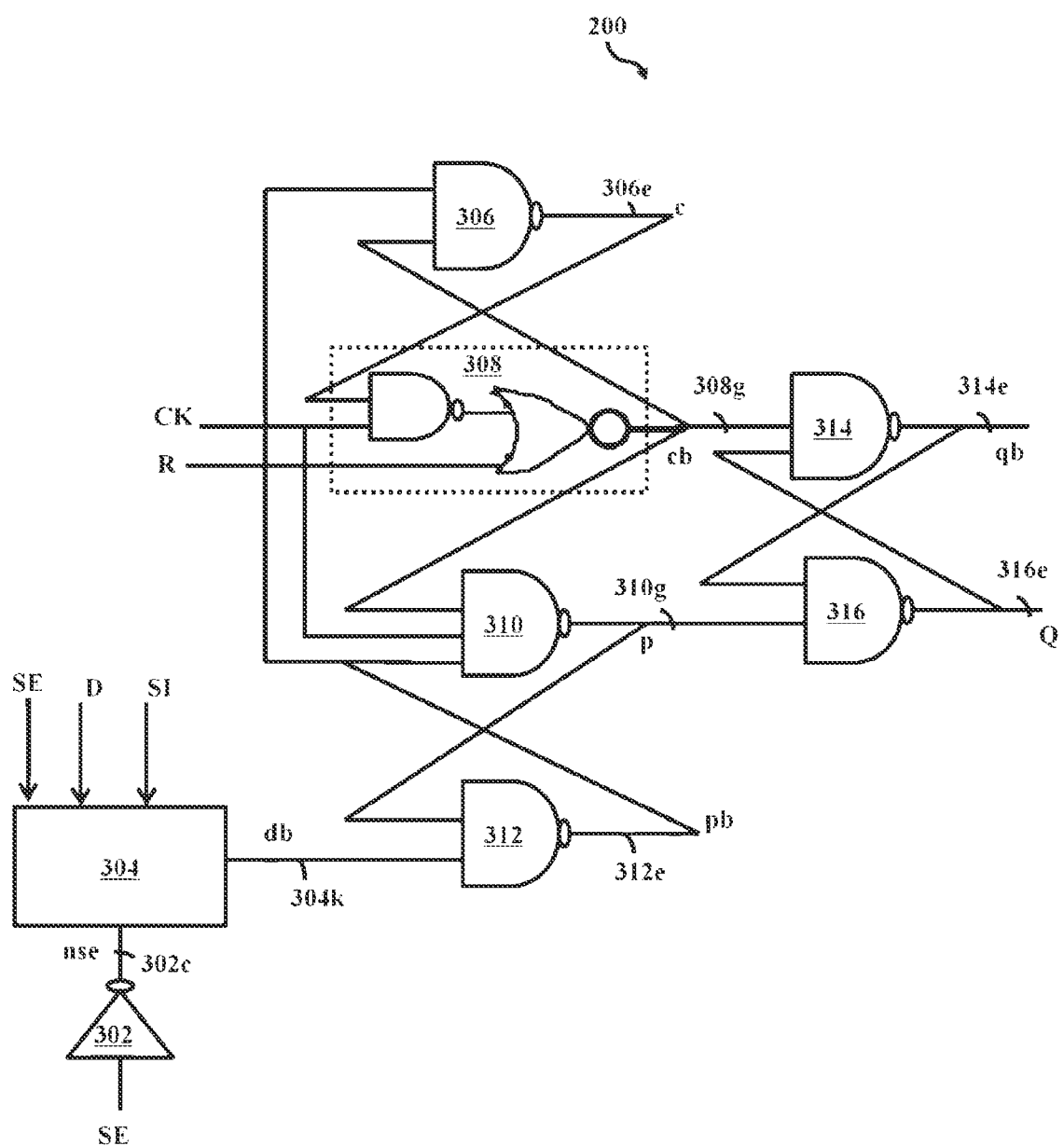
FIG. 4 is a partial-schematic logic diagram depicting a flip-flop including the reset functionality to perform the reset operation, according to an embodiment as disclosed herein.

FIG. 4 depicts the flip-flop 200 including the reset functionality to perform the reset operation, according to an embodiment as disclosed herein. The flip-flop 200 includes the master section 202, and the slave section 204 for performing the reset operation.

As depicted in FIG. 4, the master section 202 includes the first inverter circuit 302, the master stage MUX 304, the first, second, third, and fourth master stages 306-312. The first, third, and fourth master stages (306, 310, and 312) can be the NAND circuits, and the second master stage 308 can be the NAND and NOR circuit. The slave section 204 includes the first and second slave stages, which can be the NAND circuits.

Consider an exemplary scenario, wherein the clock signal CK=0, the data input D=1, the reset control signal R=1, and the scan enable signal SE=0 may be applied to the reset flip-flop 200, which has an initial output 0=0, an initial first master stage internal signal c=0, an initial second master stage internal signal cb=1, an initial third master stage internal signal p=1, an initial fourth master stage internal signal pb=1, and an initial first slave stage signal qb=1. In such a scenario, at the master stage 202, the first inverter circuit 302 outputs the inversion of the scan enable signal nse=1 on the inverter circuit output node 302c. As the inversion of the scan enable signal nse=1, the data input D=1, the master stage MUX 304 outputs the MUX internal signal db=0 (inversion of the data input D) on the master stage MUX output node 304k. The first master stage 306 outputs the first master stage internal signal c=1 on the first master stage output node 306e, as the initial second and fourth master stage internal signals cb=0, and pb=1 respectively. The outputted first master stage internal c=1, the clock signal CK=0, and the reset control signal R=1 may be provided to the second master stage 308. The second master stage 308 outputs the second master stage internal signal cb=0 on the second master stage output node 308g, as the first master stage internal signal c=1, the clock signal CK=0, and the reset control signal R=1. The second master stage internal signal cb=0 may be provided to the first slave stage 314, and the third master stage 310. The third master stage 310 outputs the third master stage signal p=1 on the third master stage output node 310g, as the second master stage internal signal cb=0, and the fourth master stage internal signal pb=1. The outputted third master signal p=1 may be provided to the second slave stage 316.

At the slave stage, the first slave stage outputs the first slave stage signal qb=1 on the first slave stage output node 314e, as the second master stage internal signal cb=0, and the output 0=1. The first slave stage signal qb=1 may be provided to the second slave stage 316. The second slave stage 316 generates the output 0=0 on the output node 316e, as the third master stage internal signal p=1, and the first slave stage signal qb=1. Thus, performing the reset operation.

Consider another exemplary scenario, wherein the clock signal CK=0, the data input D=0, the reset control signal R=1, and the scan enable signal SE=0 may be applied to the flip-flop 200, which has an initial output 0=1, an initial first master stage internal signal c=1, an initial second master stage internal signal cb=1, an initial third master stage internal signal p=1, an initial fourth master stage internal signal pb=0, and an initial first slave stage signal qb=0. In such a scenario, at the master stage 202, the inverter circuit 302 outputs the inversion of the scan enable signal nse=1 on the first inverter circuit output node 302c. As the inversion of the scan enable signal nse=1, the data input D=0, the master stage MUX 304 outputs the MUX internal signal db=1 (inversion of the data input D) on the master stage MUX output node 304k. The first master stage 306 outputs the first master stage internal signal c=1 on the first master stage output node 306e, as the initial second and fourth master stage internal signals cb=1, and pb=0 respectively. The outputted first master stage internal c=1, the clock signal CK=0, and the reset control signal R=1 may be provided to the second master stage 308. The second master stage 308 outputs the second master stage internal signal cb=0 on the second master stage output node 308g, as the first master stage internal signal c=1, the clock signal CK=0, and the reset control signal R=1. The second master stage internal signal cb=0 may be provided to the first slave stage 314, and the third master stage 310. The third master stage 310 outputs the third master stage signal p=1 on the third master stage output node 310g, as the second master stage internal signal cb=0, and the fourth master stage internal signal pb=1. The outputted third master signal p=1 may be provided to the second slave stage 316.

At the slave stage, the first slave stage outputs the first slave stage signal qb=1 on the first slave stage output node 314e, as the second master stage internal signal cb=0, and the initial output 0=0. The first slave stage signal qb=1 may be provided to the second slave stage 316. The second slave stage 316 generates the output 0=0 on the output node 316e, as the third master stage internal signal p=1, and the first slave stage signal qb=1. Thus, performing the reset operation.

Figure 5:
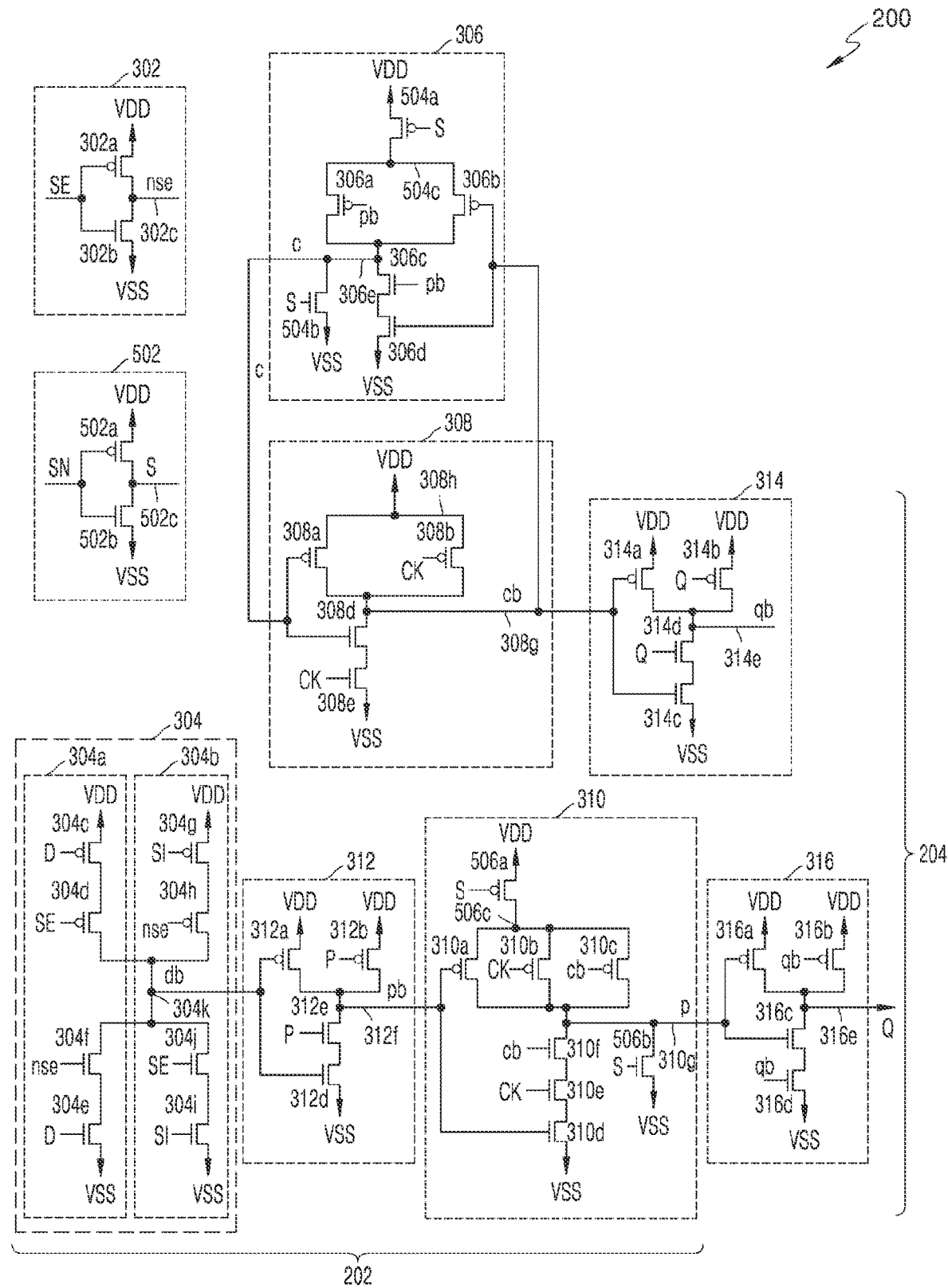
FIG. 5 is a schematic circuit diagram depicting a flip-flop including a set functionality, according to an embodiment as disclosed herein.

FIG. 5 depicts the flip-flop 200 including a set functionality, according to an embodiment as disclosed herein. An embodiment herein enables the flip-flop 200 to perform a set operation by including a set functionality. The set functionality may be achieved by adding transistors in the first master stage 306, and the third master stage 310 of the master section 202. In an embodiment, the flip-flop 200 may perform the normal mode of operation, when a set control signal SN=1. In an embodiment, the flip-flop 200 may perform the set operation by generating the output 0=1, when the set control signal SN=0.

As depicted in FIG. 5, the flip-flop 200 includes the first inverter circuit 302, a second inverter circuit 502, the master stage MUX 304, and the first, second, third, and fourth master stages (306-312). The first inverter circuit 302 can be configured to output the inversion of the scan enable signal nse on the first inverter circuit output node 302c, on receiving the scan enable signal SE. The first inverter circuit 302 includes the first PMOS transistor 302a, and the first NMOS transistor 302b to output the inversion of the scan enable signal nse on the first inverter circuit output node 302c. The configurations of the transistors of the first inverter circuit 302, and their intended functions are depicted in FIGS. 3a, and 3b.

The second inverter circuit 502 can be configured to output an inversion of the set control signal S on a second inverter circuit output node 502c, on receiving the set control signal SN. The second inverter circuit 502 performs the invert operation on the set control signal SN to output the inversion of the set control signal S on the second inverter circuit output node 502c. The second inverter circuit 502 includes a twentieth PMOS transistor 502a, and a twentieth NMOS transistor 502b to output the inversion of the set control signal S on the second inverter circuit output node 502c. The twentieth PMOS transistor 502a can be connected to the VDD voltage, the set control signal SN, and the second inverter circuit output node 502c. The twentieth PMOS transistor 502a includes a source connected to the VDD voltage, a gate connected to the set control signal SN, and a drain connected to the second inverter circuit output node 502c. The twentieth NMOS transistor 502b can be connected to the VSS voltage, the set control signal SN, and the second inverter circuit output node 502c. The twentieth NMOS transistor 502b includes a source connected to the VSS voltage, a gate connected to the set control signal SN, and the drain connected to the second inverter circuit output node 502c. In an embodiment, when the set control signal SN=0, the twentieth PMOS transistor 502a turns ON and outputs the inversion of the set control signal S=1 on the second inverter circuit output node 502c. In an embodiment, when the set control signal SN=1, the twentieth NMOS transistor 502b turns ON and outputs the inversion of the set control signal S=0 on the second inverter circuit output node 502c.

The master stage MUX 304 can be configured to output the feedback data or previously stored data db on the master stage MUX output node 304k, on receiving the data input D, the scan enable signal SE, the scan input signal SI, and the inversion of the scan enable signal nse. The master stage MUX 304 includes the first tri-state inverter 304a and the second tri-state inverter 304b to output the MUX internal signal db on the master stage MUX output node 304k. The first tri-state inverter 304a can be configured to output the inversion of the data input D as the MUX internal signal db on the master stage MUX output node 304k, based on the scan enable signal SE, and the inversion of the scan enable signal nse. The first tri-state inverter 304a includes the second PMOS transistor 304c, the third PMOS transistor 304d, the second NMOS transistor 304e, and the third NMOS transistor 304f to output the inversion of the data input D as the MUX internal signal db on the master stage MUX output node 304k. The second tri-state inverter 304b can be configured to output the inversion of the scan input signal SI as the MUX internal signal db on the master stage MUX output node 304k, based on the scan enable signal SE, and the inversion of the scan enable signal nse. The second tri-state inverter 304b includes the fourth PMOS transistor 304g, the fifth PMOS transistor 304h, the fourth NMOS transistor 304i, and the fifth NMOS transistor 304j to output the inversion of the scan input signal as the MUX internal signal db on the master stage MUX output node 304k. The configurations of the transistors of the first tri-state inverter 304a, and the second tri-state inverter 304b and their intended functions are depicted in FIGS. 3a, and 3b.

The first master stage 306 can be configured to output the first master stage internal signal c on the first master stage output node 306e, on receiving the second master stage internal signal cb from the second master stage 308, the fourth master stage internal signal pb from the fourth master stage 312, and the inversion of the set control signal S from the second inverter circuit 502. The first master stage 306 includes the sixth PMOS transistor 306a, the seventh PMOS transistor 306b, a twenty-first PMOS transistor 504a, the sixth NMOS transistor 306c, the seventh NMOS transistor 306d, and a twenty-first NMOS transistor 504b to output the first master stage internal signal c on the first master stage output node 306e. In an embodiment, if the inversion of the set control signal S=1, the twenty-first NMOS transistor 504b turns ON and outputs the first master stage internal signal c=0 on the first master stage output node 306e. If the inversion of the set control signal S=0, the first master stage 306 performs a normal functioning.

The sixth PMOS transistor 306a can be connected to a second conjunction node 504c, the fourth master stage internal signal pb outputted on the fourth master stage output node 312f, and the first master stage output node 306e. The seventh PMOS transistor 306b can be connected to the second conjunction node 504c, the second master stage internal signal cb outputted on the second master stage output node 308g, and the first master stage output node 306e. The twenty-first PMOS transistor 504a can be connected to the VDD voltage, the inversion of the set control signal S outputted on the second inverter circuit output node 502c, and the second conjunction node 504c. The sixth PMOS transistor 306a includes the source connected to the second conjunction node 504c, the gate connected to the fourth master stage internal signal pb, and the drain connected to the first master stage output node 306e. The seventh PMOS transistor 306b includes the source connected to the second conjunction node 504c, the gate connected to the second master stage internal signal cb, and the drain connected to the first master stage output node 306e. The twenty-first PMOS transistor 504a includes a source connected to the VDD voltage, a gate connected to the inversion of the set control signal S, and the drain connected to the second conjunction node 504c.

The sixth NMOS transistor 306c can be connected to the seventh NMOS transistor 306d, the fourth master stage internal signal pb outputted on the fourth master stage output node 312f, and the first master stage output node 306e. The seventh NMOS transistor 306d can be connected to the VSS voltage, and the second master stage internal signal cb outputted on the second master stage output node 308g. The twenty-first NMOS transistor 504b can be connected to the VSS voltage, the inversion of the set control signal S outputted on the second inverter circuit output node 502c, and the first master stage output node 306e. The sixth NMOS transistor 306c includes the source connected to the drain of the seventh NMOS transistor 306d, the gate connected to the fourth master stage internal signal pb, and the drain connected to the first master stage output node 306e. The seventh NMOS transistor 306d includes the source connected to the VSS voltage, and the gate connected to the second master stage internal signal cb. The twenty-first NMOS transistor 504b includes the source connected to the VSS voltage, the gate connected to the inversion of the set control signal S, and the drain connected to the first master stage output node 306e.

The second master stage 308 can be configured to output the second master stage internal signal cb on the second master stage output node 308g, on receiving the first master stage internal signal c from the first master stage 306, and the clock signal CK. The second master stage 308 performs the NAND operation on the first master stage internal signal c, and the clock signal CK to output the second master stage internal signal cb on the second master stage output node 308g. The second master stage internal signal cb may be further provided to the slave section 204. The second master stage 308 includes the eighth PMOS transistor 308a, the ninth PMOS transistor 308b, the eighth NMOS transistor 308d, and the ninth NMOS transistor 308e to output the second master stage internal signal cb on the second master stage output node 308g.

The eighth PMOS transistor 308a can be connected to the first conjunction node 308h, the first master stage internal signal c outputted on the first master stage output node 306e, and the second master stage output node 308g. The first conjunction node 308h can be connected to the VDD voltage. The ninth PMOS transistor 308b can be connected to the first conjunction node 308h, the clock signal CK, and the second master stage output node 308g. The eighth PMOS transistor 308a includes the source connected to the first conjunction node 308h, the gate connected to the first master stage internal signal c, and the drain connected to the second master stage output node 308g. The ninth PMOS transistor 308b includes the source connected the first conjunction node 308h, the gate connected to the clock signal CK, and the drain connected to the second master stage output node 308g.

The eighth NMOS transistor 308d can be connected to the second master stage output node 308g, the first master stage internal signal c outputted on the first master stage output node 306e, and the ninth NMOS transistor 308e. The ninth NMOS transistor 308e can be connected to the VSS voltage and the clock signal CK. The eighth NMOS transistor 308d includes the source connected to the drain of the ninth NMOS transistor 308e, the gate connected to the first master stage internal signal c, and the drain connected to the second master stage output node 308g. The ninth NMOS transistor 308e includes the source connected to the VSS voltage, and the gate connected to the clock signal CK.

The third master stage 310 can be configured to output the third master stage internal signal p on the third master stage output node 310g, on receiving the second master stage internal signal cb from the second master stage 310, the clock signal CK, the fourth master stage internal signal pb from the fourth master stage 312, and the inversion of the set control signal S from the second inverter circuit 502. The third master stage internal signal p may be further provided to the slave section 204. The third master stage 310 includes the eleventh PMOS transistor 310a, the twelfth PMOS transistor 310b, the thirteenth PMOS transistor 310c, a twenty-second PMOS transistor 506a, the eleventh NMOS transistor 310d, the twelfth NMOS transistor 310e, the thirteenth NMOS transistor 310f, and a twenty-second NMOS transistor 506b to output the third master stage internal signal p on the third master stage output node 310g. In an embodiment, if the inversion of the set control signal S=1, the twenty-second NMOS transistor 506b turns ON and outputs the third master stage internal signal p=0 on the third master stage output node 310g. If the inversion of the set control signal S=0, the first master stage 306 performs a normal functioning The eleventh PMOS transistor 310a can be connected to a third conjunction node 506c, the fourth master stage internal signal pb outputted on the fourth master stage output node 312f, and the third master stage output node 310g. The twelfth PMOS transistor 310b can be connected to the third conjunction node 506c, the clock signal CK, and the third master stage output node 310g. The thirteenth PMOS transistor 310c can be connected to the third conjunction node 506c, the second master stage internal signal cb outputted on the second master stage output node 308g, and the third master stage output node 310g. The twenty-second PMOS transistor 506a can be connected to the VDD voltage, the inversion of the set control signal S outputted on the second inverter circuit output node 504c, and the third conjunction node 506c. The eleventh PMOS transistor 310a includes the source connected to the third conjunction node 506c, the gate connected to the fourth master stage internal signal pb, and the drain connected to the third master stage output node 310g. The twelfth PMOS transistor 310b includes the source connected to the third conjunction node 506c, the gate connected to the clock signal CK, and the drain connected to the third master stage output node 310g. The thirteenth PMOS transistor 310c includes the source connected to the third conjunction node 506c, the gate connected to the second master stage internal signal cb, and the drain connected to the third master stage output node 310g. The twenty-second PMOS transistor 506a includes a source connected to the VDD voltage, a gate connected to the inversion of the set control signal S, and the drain connected to the third conjunction node 506c.

The eleventh NMOS transistor 310d can be connected to the VSS voltage, the fourth master stage internal signal pb outputted on the fourth master stage output node 312f, and the twelfth NMOS transistor 310e. The twelfth NMOS transistor 310e can be connected to the clock signal CK, and the thirteenth NMOS transistor 310f. The thirteenth NMOS transistor 310f can be connected to the second master stage internal signal cb outputted on the second master stage output node 308g, and the third master stage output node 310g. The twenty-second NMOS transistor 506b can be connected to the VSS voltage, the inversion of the set control signal S outputted on the second inverter output node 502c, and the third master stage output node 310g. The eleventh NMOS transistor 310d includes the source connected to the VSS voltage, the gate connected to the fourth master stage internal signal pb, and the drain connected to the source of the twelfth NMOS transistor 310e. The twelfth NMOS transistor 310e includes the gate connected to the clock signal CK, and the drain connected to a source of the thirteenth NMOS transistor 310f. The thirteenth NMOS transistor 310f includes the gate connected to the second master stage internal signal cb, and the drain connected to the third master stage output node 310g. The twenty-second NMOS transistor 506b includes a source connected to the VSS voltage, a gate connected to the inversion of the set control signal S and the drain connected to the third master stage output node 310g.

The fourth master stage 312 can be configured to output the fourth master stage internal signal pb on the fourth master stage output node 312f, on receiving the third master stage internal signal p from the third master stage 310, and the MUX internal signal db from the master stage MUX 304. The fourth master stage 312 includes the fourteenth PMOS transistor 312a, the fifteenth PMOS transistor 312b, the fourteenth NMOS transistor 312d, and the fifteenth NMOS transistor 312e to output the fourth master stage internal signal pb on the fourth master stage output node 312f. The configurations of the transistors of the fourth master stage 312, and their intended functions are depicted in FIGS. 3a, and 3b.

The slave section 204 can be configured to generate the output Q, on receiving the second and third master stage internal signals cb, and p from the master stage 202. The slave section 204 includes the first slave stage or sub-section 314, and the second slave stage or sub-section 316 for generating the output Q. The first and second slave stages (314, 316) can depict the NAND circuits or stages.

the first slave stage 314 can be configured to output the first slave stage signal qb on the first slave stage output node 314e, on receiving the second master stage internal signal cb from the second master stage 308 of the master section 202, and the output Q from the second slave stage 316. The first slave stage 314 includes the sixteenth PMOS transistor 314a, the seventeenth PMOS transistor 314b, the sixteenth NMOS transistor 314c, and the seventeenth NMOS transistor 314d to output the first slave stage signal qb on the first slave stage output node 314e. The configurations of the transistors of the first slave stage 314, and their intended functions are depicted in FIGS. 3a, and 3c.

The second slave stage 316 can be configured to generate the output Q on an output node 316e, on receiving the third master stage internal signal p from the third master stage 310 of the master section 202, and the first slave stage signal qb from the first slave stage 314. The second slave stage 316 includes the eighteenth PMOS transistor 316a, the nineteenth PMOS transistor 316b, the eighteenth NMOS transistor 316c, and the nineteenth NMOS transistor 316d to generate the output Q on the output node 316e. The configurations of the transistors of the second slave stage 316, and their intended functions are depicted in FIGS. 3a, and 3c.

Figure 6:
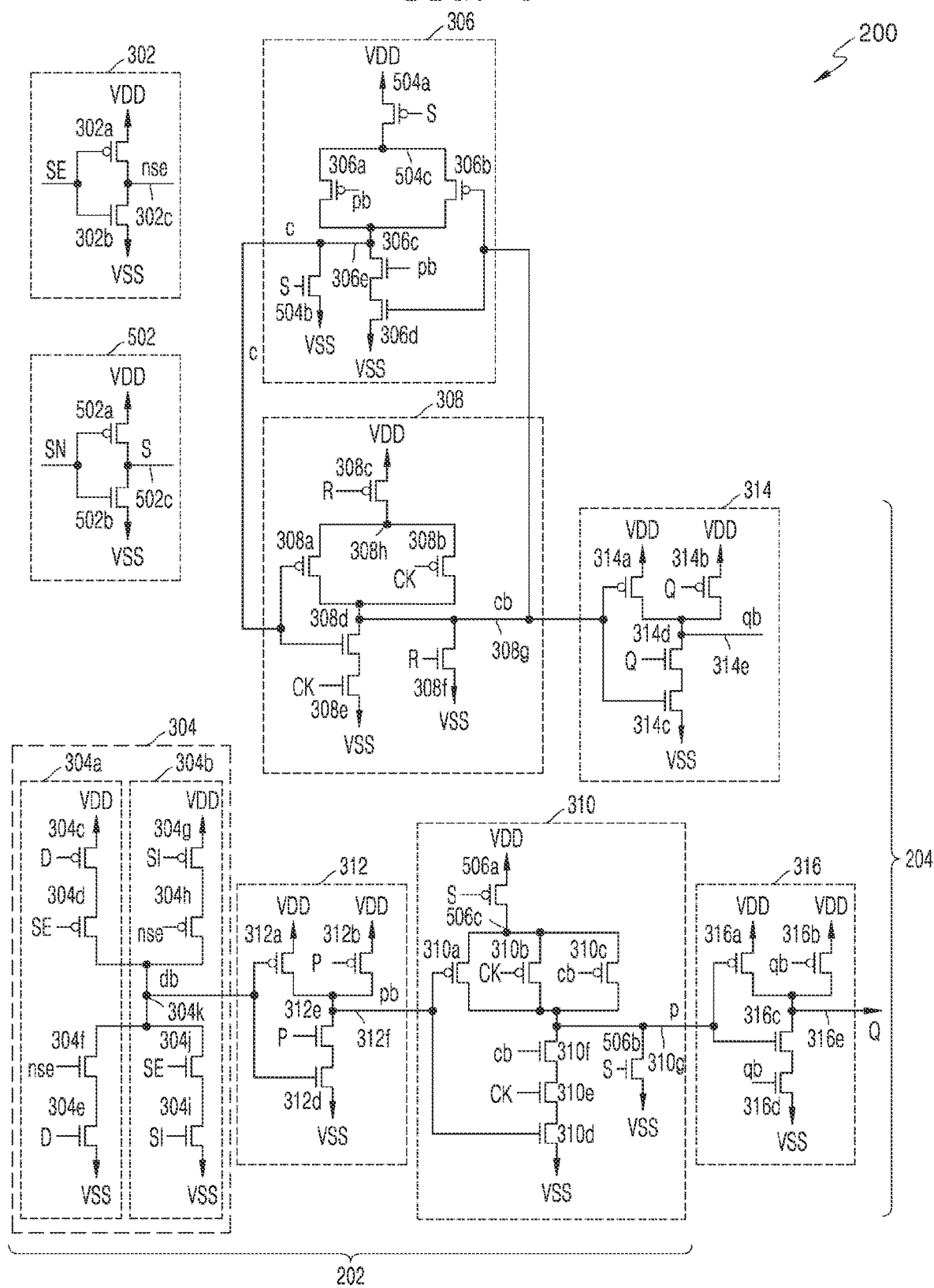
FIG. 6 is a schematic circuit diagram depicting the flip-flop including a set-reset functionality with a set priority, according to an embodiment as disclosed herein.

FIG. 6 depicts the flip-flop 200 including a set-reset functionality with a set priority, according to an embodiment as disclosed herein. The flip-flop 200 may include the set-reset functionality with the set priority to perform the set operation or the reset operation. When the set control signal SN=0, and the reset control signal R=0, the flip-flop 200 performs the set operation. When the set control signal SN=1, and the reset control signal R=1, the flip-flop 200 performs the reset operation. When the set control signal SN=0, and the reset control signal R=1, the flip-flop 200 performs the set operation, as the flip-flop 200 includes the set priority.

As depicted in FIG. 6, the flip-flop 200 includes the master section 202, and the slave section 204 to perform the set or reset operation. The master section 202 includes the first inverter circuit 302, the second inverter circuit 502, the master stage MUX 304, and the first, second, third, and fourth master stages (306-312). The first inverter circuit 302 can be configured to output the inversion of the scan enable signal nse on the first inverter circuit output node 302c, on receiving the scan enable signal SE. The first inverter circuit 302 includes the first PMOS transistor 302a, and the first NMOS transistor 302b to output the inversion of the scan enable signal nse on the first inverter circuit output node 302c. The configurations of the transistors of the first inverter circuit 302, and their intended functions are depicted in FIGS. 3a, and 3b.

The second inverter circuit 502 can be configured to output the inversion of the set control signal S on the second inverter circuit output node 502c, on receiving the set control signal SN. The second inverter circuit 502 includes the twentieth PMOS transistor 502a, and the twentieth NMOS transistor 502b to output the inversion of the set control signal S on the second inverter circuit output node 502c. The configurations of the transistors of the second inverter circuit 502, and their intended functions are depicted in FIG. 5.

The master stage MUX 304 can be configured to output the MUX internal signal data db on the master stage MUX output node 304k, on receiving the data input D, the scan enable signal SE, the scan input signal SI, and the inversion of the scan enable signal nse. The master stage MUX 304 includes the first tri-state inverter 304a and the second tri-state inverter 304b to output the MUX internal signal db on the master stage MUX output node 304k. The first tri-state inverter 304a can be configured to output the inversion of the data input D as the MUX internal signal db on the master stage MUX output node 304k, based on the scan enable signal SE, and the inversion of the scan enable signal nse. The first tri-state inverter 304a includes the second PMOS transistor 304c, the third PMOS transistor 304d, the second NMOS transistor 304e, and the third NMOS transistor 304f to output the inversion of the data input D as the MUX internal signal db on the master stage MUX output node 304k. The second tri-state inverter 304b can be configured to output the inversion of the scan input signal SI as the MUX internal signal db on the master stage MUX output node 304k, based on the scan enable signal SE, and the inversion of the scan enable signal nse. The second tri-state inverter 304b includes the fourth PMOS transistor 304g, the fifth PMOS transistor 304h, the fourth NMOS transistor 304i, and the fifth NMOS transistor 304j to output the inversion of the scan input signal as the MUX internal signal db on the master stage MUX output node 304k. The configurations of the transistors of the first tri-state inverter 304a, and the second tri-state inverter 304b and their intended functions are depicted in FIGS. 3a, 3b, and 5.

The first master stage 306 can be configured to output the first master stage internal signal c on the first master stage output node 306e, on receiving the second master stage internal signal cb from the second master stage 308, the fourth master stage internal signal pb from the fourth master stage 312, and the inversion of the set control signal S from the second inverter circuit 502. The first master stage 306 includes the sixth PMOS transistor 306a, the seventh PMOS transistor 306b, the twenty-first PMOS transistor 504a, the sixth NMOS transistor 306c, the seventh NMOS transistor 306d, and the twenty-first NMOS transistor 504b to output the first master stage internal signal c on the first master stage output node 306e. In an embodiment, the twenty-first PMOS and NMOS transistors (504a, 504b) may be implemented in the second master stage 308 for achieving the set functionality to perform the set operation. The configurations of the transistors of the first master stage 306, and their intended functions are depicted in FIG. 5.

The second master stage 308 can be configured to output the second master stage internal signal cb on the second master stage output node 308g, on receiving the first master stage internal signal c from the first master stage 306, the clock signal CK, and the reset control signal R. The second master stage internal signal cb may be further provided to the slave section 204 (as depicted in FIG. 6). The second master stage 308 includes the eighth PMOS transistor 308a, the ninth PMOS transistor 308b, the tenth PMOS transistor 308c, the eighth NMOS transistor 308d, the ninth NMOS transistor 308e, and the tenth NMOS transistor 308f. In an embodiment, the tenth PMOS and NMOS transistors (308c, 308f) may be implemented in the second master stage 308 for achieving reset functionality to perform the reset operation. The configurations of the transistors of the second master stage 308, and their intended functions are depicted in FIGS. 3a, and 3b.

The third master stage 310 can be configured to output the third master stage internal signal p on the third master stage output node 310g, on receiving the second master stage internal signal cb from the second master stage 310, the clock signal CK, the fourth master stage internal signal pb from the fourth master stage 312, and the inversion of the set control signal S from the second inverter circuit 502. The third master stage internal signal p may be further provided to the slave section 204. The third master stage 310 includes the eleventh PMOS transistor 310a, the twelfth PMOS transistor 310b, the thirteenth PMOS transistor 310c, the twenty-second PMOS transistor 506a, the eleventh NMOS transistor 310d, the twelfth NMOS transistor 310e, the thirteenth NMOS transistor 310f, and the twenty-second NMOS transistor 506b to output the third master stage internal signal p on the third master stage output node 310g. The configurations of the transistors of the third master stage 310, and their intended functions are depicted in FIG. 5.

The fourth master stage 312 can be configured to output the fourth master stage internal signal pb on the fourth master stage output node 312f, on receiving the third master stage internal signal p from the third master stage 310, and the MUX internal signal db from the master stage MUX 304. The fourth master stage 312 includes the fourteenth PMOS transistor 312a, the fifteenth PMOS transistor 312b, the fourteenth NMOS transistor 312d, and the fifteenth NMOS transistor 312e to output the fourth master stage internal signal pb on the fourth master stage output node 312f. The configurations of the transistors of the fourth master stage 312, and their intended functions are depicted in FIGS. 3a, 3b, and 5.

The slave section 204 can be configured to generate the output Q, on receiving the second and third master stage internal signals cb, and p from the master stage 202. The slave section 204 includes the first slave stage or sub-section 314, and the second slave stage or sub-section 316 for generating the output Q. The first and second slave stages (314, 316) can the NAND circuits or stages.

the first slave stage 314 can be configured to output the first slave stage signal qb on the first slave stage output node 314e, on receiving the second master stage internal signal cb from the second master stage 308 of the master section 202, and the output Q from the second slave stage 316. The first slave stage 314 includes the sixteenth PMOS transistor 314a, the seventeenth PMOS transistor 314b, the sixteenth NMOS transistor 314c, and the seventeenth NMOS transistor 314d to output the first slave stage signal qb on the first slave stage output node 314e. The configurations of the transistors of the first slave stage 314, and their intended functions are depicted in FIGS. 3a, 3b, and 5.

The second slave stage 316 can be configured to generate the output Q on an output node 316e, on receiving the third master stage internal signal p from the third master stage 310 of the master section 202, and the first slave stage signal qb from the first slave stage 314. The second slave stage 316 includes the eighteenth PMOS transistor 316a, the nineteenth PMOS transistor 316b, the eighteenth NMOS transistor 316c, and the nineteenth NMOS transistor 316d to generate the output Q on the output node 316e. The configurations of the transistors of the second slave stage 316, and their intended functions are depicted in FIGS. 3a, 3b, and 5.

An exemplary embodiment reset flip-flop circuit includes a first reset transistor having a first connection terminal connected to a first power line, a control terminal connected to a reset line, and a second connection terminal; and a second reset transistor having a first connection terminal connected to the second connection terminal of the first reset transistor, a control terminal connected to the reset line, and a second connection terminal connected to a second power line. The reset flip-flop circuit may include a third transistor connected between the first connection terminal of the second reset transistor and the second connection terminal of the first reset transistor.

The reset flip-flop circuit may include the third transistor that has a control terminal connected to a true single-phase clock (TSPC) line. The reset flip-flop circuit may include a fourth transistor having a first connection terminal connected to the first power line, a control terminal connected to a data line, and a second connection terminal; a fifth transistor having a first connection terminal connected to the second connection terminal of the fourth transistor, a control terminal connected to a scan-enable line, and a second connection terminal; and a sixth transistor having a first connection terminal connected to the second connection terminal of the fifth transistor, a control terminal connected to a scan line, and a second connection terminal connected to the second power line.

Figure 7:
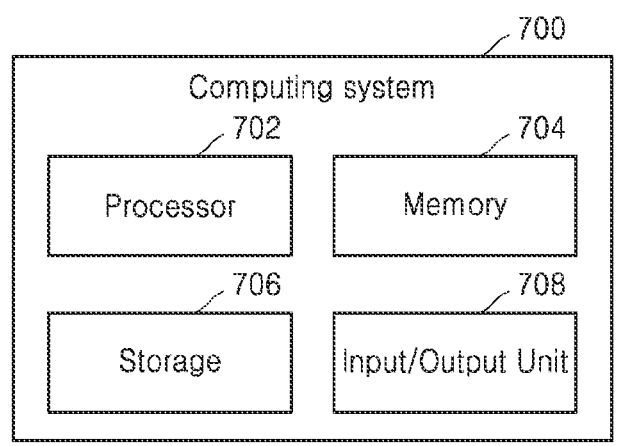
FIG. 7 is a schematic block diagram depicting an exemplary computing system including a flip-flop, according to an embodiment as disclosed herein.

FIG. 7 depicts an exemplary computing system 700 including the flip-flop 200, according to an embodiment as disclosed herein. The computing system 700 includes a processor 702, a memory 704, a storage 706, an input/output unit 708, and the like. In embodiment, at least one of, but not limited to, a plurality of semiconductor devices, integrated circuits, sequential logic circuits, and the like, which are included in the processor 702, the memory 704, the storage 706, and the input/output unit 708 may include the flip-flop 200.

The processor 702 may perform certain arithmetic operations or tasks. In an embodiment, the processor 702 can be at least one of a single processer, a plurality of processors, multiple homogenous cores, multiple heterogeneous cores, multiple Central Processing Unit (CPUs) of different kinds and the like. The processor 702 may communicate with the memory 704, the storage 706, and the input/output unit 708 through a bus such as an address bus, a control bus, a data bus, and/or the like. The processor 702 may also be connected to an extension bus such as a peripheral component interconnect (PCI) bus or the like.

The memory 704 may store data necessary for an operation of the computing system 702. The memory 704 may include one or more computer-readable storage media. The memory 704 may include non-volatile storage elements. Examples of such non-volatile storage elements may include magnetic hard discs, optical discs, floppy discs, flash memories, or forms of electrically programmable memories (EPROM) or electrically erasable and programmable (EEPROM) memories. In addition, the memory 704 may, in some examples, be considered a non-transitory storage medium. The term "non-transitory" may indicate that the storage medium is not embodied in a carrier wave or a propagated signal. However, the term "non-transitory" should not be interpreted to mean that the memory 704 is non-movable. In certain examples, a non-transitory storage medium may store data that can, over time, change (e.g., in Random Access Memory (RAM) or cache). In addition, the memory 704 may include, but is not limited to, a dynamic random access memory (DRAM), a mobile DRAM, a static random access memory (SRAM), a phase-change random access memory (PRAM), a ferroelectric random access memory (FRAM), a resistive random access memory (RRAM), a magnetic random access memory (MRAM), and the like.

The storage 706 may include a solid-state drive, a hard disk drive, a CD-ROM, and/or the like. The input/output unit 708 may include an input means, such as a keyboard, keypad, a mouse, and/or the like, and an output means such as a printer, a display, and/or the like.

An embodiment disclosed herein can be implemented through at least one software program running on at least one hardware device and performing network management functions to control the elements. The elements shown in FIGS. 2a-7 can be at least one of a hardware device, or a combination of hardware device and software module.

The foregoing description of specific exemplary embodiments will so fully reveal the general nature of such embodiments herein that others can, by applying current or future knowledge, readily modify and/or adapt for various applications such embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of exemplary embodiments, those of ordinary skill in the pertinent art will recognize that the embodiments herein can be practiced with modification within the spirit and scope of the embodiments as described herein.

What is claimed is:
1. A flip-flop comprising:
a master section coupled to a True Single-Phase Clock (TSPC) and configured to output a plurality of internal signals, on receiving a data input, a scan enable signal, a scan input signal, a reset control signal, and a clock signal; and a slave section coupled to the master section and configured to generate an output on receiving the plurality of internal signals from the master section, wherein the master section comprises:
- a first inverter circuit configured to output an inversion of the scan enable signal on a first inverter circuit output node by performing an invert operation on the received scan enable signal;
- a first master stage multiplexer (MUX) configured to output a MUX internal signal on a master stage MUX output node by performing the invert operation on at least one of the data input and scan input signal, based on the scan enable signal, and the inversion of the scan enable signal received from the first inverter circuit;
- a first master stage configured to output a first master stage internal signal on a first master stage output node by performing a NAND operation on a second master stage internal signal received from a second master stage, and a fourth master stage internal signal from a fourth master stage;
- the second master stage configured to output the second master stage internal signal on a second master stage output node by performing a NAND and NOR operation on the first master stage internal signal received from the first master stage, the clock signal, and the reset control signal;
- a third master stage configured to output a third master stage internal signal on a third master stage output node by performing the NAND operation on the second master stage internal signal received from the second master stage, the clock signal, and the fourth master stage internal signal received from the fourth master stage; and
- the fourth master stage configured to output the fourth master stage internal signal on a fourth master stage output node by performing the NAND operation on the third master stage internal signal received from the third master stage, and the MUX internal signal received from the master stage MUX.

2. The flip-flop of claim 1, wherein the first master stage, the third master stage, and the fourth master stage are NAND circuits, wherein the second master stage is a NAND circuit followed by a NOR circuit.

3. The flip-flop of claim 1, wherein
the first inverter circuit includes a first P-type Metal Oxide Semiconductor (PMOS) transistor, and a first N-type Metal Oxide Semiconductor (NMOS) transistor to output the inversion of the scan enable signal on the first inverter circuit output node;
the master stage MUX includes a first tri-state inverter and a second tri-state inverter to output the MUX internal signal on the master stage MUX output node;
the first master stage includes a sixth PMOS transistor, a seventh PMOS transistor, a sixth NMOS transistor, and a seventh NMOS transistor to output the first master stage internal signal on the first master stage output node;
the second master stage includes an eighth PMOS transistor, a ninth PMOS transistor, a tenth PMOS transistor, an eighth NMOS transistor, a ninth NMOS transistor, and a tenth NMOS transistor to output the second master stage internal signal on the second master stage output node;
the third master stage includes an eleventh PMOS transistor, a twelfth PMOS transistor, a thirteenth PMOS transistor, an eleventh NMOS transistor, a twelfth NMOS transistor, and a thirteenth NMOS transistor to output the third master stage internal signal on the third master stage output node; and
the fourth master stage includes a fourteenth PMOS transistor, a fifteenth PMOS transistor, a fourteenth NMOS transistor, and a fifteenth NMOS transistor to output the fourth master stage internal signal on the fourth master stage output node.

4. The flip-flop of claim 3, wherein
the first PMOS transistor includes a source connected to a VDD voltage, a gate connected to the scan enable signal, and a drain connected to the first inverter circuit output node; and
the first NMOS transistor includes a source connected to a VSS voltage, a gate connected to the scan enable signal, and the drain connected to the first inverter circuit output node.

5. The flip-flop of claim 3, wherein
the first tri-state inverter includes a second PMOS transistor, a third PMOS transistor, a second NMOS transistor, and a third NMOS transistor to output an inversion of the data input as the MUX internal signal on the master stage MUX output node, when the scan enable signal is at a logic low level, and the inversion of the scan enable signal is at a logic high level; and
the second tri-state inverter includes a fourth PMOS transistor, a fifth PMOS transistor, a fourth NMOS transistor, and a fifth NMOS transistor to output the inversion of the scan input signal as the MUX internal signal on the master stage MUX output node, when the scan enable signal is at the logic high level, and the inversion of the scan enable signal is at the logic low level.

6. The flip-flop of claim 5, wherein
the second PMOS transistor includes a source connected to a VDD voltage, a gate connected to the data input, and a drain connected to a source of the third PMOS transistor;
the third PMOS transistor includes a gate connected to the scan enable signal, and a drain connected to the master stage MUX output node;
the second NMOS transistor includes a source connected to a VSS voltage, a gate connected to the data input, and a drain connected to a source of the third NMOS transistor;
the third NMOS transistor includes a gate connected to the inversion of the scan enable signal, and a drain connected to the master stage MUX output node;
the fourth PMOS transistor includes a source connected to the VDD voltage, a gate connected to the scan input signal, and a drain connected to a source of the fifth PMOS transistor;
the fifth PMOS transistor includes a gate connected to the inversion of the scan enable signal, and a drain connected to the master stage MUX output node;
the fourth NMOS transistor includes a source connected to the VSS voltage, a gate connected to the scan input signal, and a drain connected to a source of the fifth NMOS transistor; and
the fifth NMOS transistor includes a gate connected to the scan enable signal, and a drain connected to the master stage MUX output node.

7. The flip-flop of claim 3, wherein
the sixth PMOS transistor includes a source connected to a VDD voltage, a gate connected to the fourth master stage internal signal, and a drain connected to the first master stage output node;

the seventh PMOS transistor includes a source connected to the VDD voltage, a gate connected to the second master stage internal signal, and a drain connected to the first master stage output node;
the sixth NMOS transistor includes a source connected to a drain of the seventh NMOS transistor, a gate connected to the fourth master stage internal signal, and a drain connected to the first master stage output node; and
the seventh NMOS transistor includes a source connected to a VSS voltage, and a gate connected to the second master stage internal signal.

8. The flip-flop of claim 3, wherein
the eighth PMOS transistor includes a source connected to a first conjunction node, a gate connected to the first master stage internal signal, and a drain connected to the second master stage output node;
the ninth PMOS transistor includes a source connected the first conjunction node, a gate connected to the clock signal, and a drain connected to the second master stage output node;
the tenth PMOS transistor includes a source connected to a VDD voltage, a gate connected to the reset control signal, and a drain connected to the first conjunction node;
the eighth NMOS transistor includes a source connected to a drain of the ninth NMOS transistor, a gate connected to the first master stage internal signal, and a drain connected to the second master stage output node;
the ninth NMOS transistor includes a source connected to a VSS voltage, and a gate connected to the clock signal; and
the tenth NMOS transistor includes a source connected to the VSS voltage, a gate connected to the reset control signal, and a drain connected to the second master stage output node.

9. The flip-flop of claim 3, wherein
the eleventh PMOS transistor includes a source connected to a VDD voltage, a gate connected to the fourth master stage internal signal, and a drain connected to the third master stage output node;
the twelfth PMOS transistor includes a source connected to the VDD voltage, a gate connected to the clock signal, and a drain connected to the third master stage output node;
the thirteenth PMOS transistor includes a source connected to the VDD voltage, a gate connected to the second master stage internal signal, and a drain connected to the third master stage output node;
the eleventh NMOS transistor includes a source connected to a VSS voltage, a gate connected to the fourth master stage internal signal, and a drain connected to a source of the twelfth NMOS transistor;
the twelfth NMOS transistor includes a gate connected to the clock signal, and a drain connected to a source of the thirteenth NMOS transistor; and
the thirteenth NMOS transistor includes a gate connected to the second master stage internal signal, and a drain connected to the third master stage output node.

10. The flip-flop of claim 3, wherein
the fourteenth PMOS transistor includes a source connected to a VDD voltage, a gate connected to the MUX internal signal, and a drain connected to the fourth master stage output node;
the fifteenth PMOS transistor includes a source connected to the VDD voltage, a gate connected to the third master stage internal signal, and a drain connected to the fourth master stage output node;
the fourteenth NMOS transistor includes a source connected to a VSS voltage, a gate connected to the MUX internal signal, and a drain connected to a source of the fifteenth NMOS transistor; and
the fifteenth NMOS transistor includes a gate connected to the third master stage internal signal, and a drain connected to the fourth master stage output node.

11. The flip-flop of claim 1, wherein the slave section comprises:
a first slave stage configured to output a first slave stage signal on a first slave stage output node by performing the NAND operation on the second master stage internal signal received from the second master stage of the master section, and the output received from a second slave stage; and
the second slave stage configured to generate the output on an output node by performing the NAND operation on the third master stage internal signal received from the third master stage of the master section, and the first slave stage signal received from the first slave stage, wherein the output corresponds to a logic '0', when the reset control signal is at a logic high level.

12. The flip-flop of claim 11, wherein
the first slave stage includes a sixteenth PMOS transistor, a seventeenth PMOS transistor, a sixteenth NMOS transistor, and a seventeenth NMOS transistor to output the first slave stage signal on the first slave stage output node; and
the second slave stage includes an eighteenth PMOS transistor, a nineteenth PMOS transistor, an eighteenth NMOS transistor, and a nineteenth NMOS transistor to generate the output on the output node.

13. The flip-flop of claim 12, wherein
the sixteenth PMOS transistor includes a source connected to a VDD voltage, a gate connected to the second master stage internal signal, and a drain connected to the first slave stage output node;
the seventeenth PMOS transistor includes a source connected to the VDD voltage, a gate connected to the output, and a drain connected to the first slave stage output node;
the sixteenth NMOS transistor includes a source connected to a VSS voltage, a gate connected to the second master stage internal signal, and a drain connected to a source of the seventeenth NMOS transistor; and
the seventeenth NMOS transistor includes a gate connected to the output, and a drain connected to the first slave stage output node.

14. The flip-flop of claim 12, wherein
the eighteenth PMOS transistor includes a source connected to a VDD voltage, a gate connected to the third master stage internal signal, and a drain connected to the output node;
the nineteenth PMOS transistor includes a source connected to the VDD voltage, a gate connected to the first slave stage signal, and a drain connected to the output node;
the eighteenth NMOS transistor includes a source connected to a drain of the nineteenth NMOS transistor, a gate connected to the third master stage internal signal, and a drain connected to the output node; and
the nineteenth NMOS transistor includes a source connected to a VSS voltage, and a gate connected to the first slave stage signal.

15. The flip-flop of claim 1, wherein the flip-flop is a reset flip-flop configured to:
perform a reset operation, when the received reset control signal is at a logic high level; and
perform at least one of a data storage operation or a scan test operation based on the scan enable signal, when the received reset control signal is at a logic low level.

16. A flip-flop circuit comprising:
a master section coupled to a True Single-Phase Clock (TSPC) and configured to output a plurality of internal signals, on receiving a data input, a scan enable signal, a scan input signal, and a clock signal; and
a slave section coupled to the master section and configured to generate an output on receiving the plurality of internal signals from the master section,
wherein the flip-flop circuit includes a set functionality,
wherein the flip-flop circuit including the set functionality comprises:
a first inverter circuit configured to output an inversion of the scan enable signal on a first inverter circuit output node by performing an invert operation on the received scan enable signal;
a first master stage multiplexer (MUX) configured to output a MUX internal signal on a master stage MUX output node by performing the invert operation on at least one of the data input and scan input signal, based on the scan enable signal, and the inversion of the scan enable signal received from the first inverter circuit;
a first master stage configured to output a first master stage internal signal on a first master stage output node by performing a NAND operation on a second master stage internal signal received from a second master stage, and a fourth master stage internal signal from a fourth master stage;
the second master stage configured to output the second master stage internal signal on a second master stage output node by performing a NAND and NOR operation on the first master stage internal signal received from the first master stage, the clock signal, and a reset control signal;
a third master stage configured to output a third master stage internal signal on a third master stage output node by performing the NAND operation on the second master stage internal signal received from the second master stage, the clock signal, and the fourth master stage internal signal received from the fourth master stage; and
the fourth master stage configured to output the fourth master stage internal signal on a fourth master stage output node by performing the NAND operation on the third master stage internal signal received from the third master stage, and the MUX internal signal received from the master stage MUX
a twentieth PMOS transistor, and a twentieth NMOS transistor in a second inverter circuit configured to: output an inversion of a set control signal on a second inverter circuit output node by performing the invert operation on the set control signal;
a twenty-first PMOS transistor, and a twenty-first NMOS transistor in the first master stage configured to: output the first master stage internal signal on the first master stage output node on receiving the inversion of the set control signal from the second inverter circuit;
an eighth PMOS transistor, a ninth PMOS transistor, an eighth NMOS transistor, and a ninth NMOS transistor in the second master stage configured to output the second master stage internal signal on the second master stage output node on receiving the first master stage internal signal from the first master stage, and the clock signal; and
a twenty-second PMOS transistor, and a twenty-second NMOS transistor in the third master stage configured to: output the third master stage internal signal on the third master stage output node on receiving the inversion of the set control signal from the second inverter circuit.

17. The flip-flop circuit of claim 16, wherein the flip-flop circuit further includes a set-reset functionality with a set priority,
wherein the flip-flop circuit including the set-reset functionality comprises:
the twentieth PMOS transistor, and the twentieth NMOS transistor in the second inverter circuit configured to: output the inversion of the set control signal on the second inverter circuit output node by performing the invert operation on the set control signal;
the twenty-first PMOS transistor, and the twenty-first NMOS transistor in the first master stage configured to: output the first master stage internal signal on the first master stage output node on receiving the inversion of the set control signal from the second inverter circuit; and
the twenty-second PMOS transistor, and the twenty-second NMOS transistor in the third master stage configured to: output the third master stage internal signal on the third master stage output node on receiving the inversion of the set control signal from the second inverter circuit.

18. A reset flip-flop circuit comprising:
a first reset transistor having a first connection terminal connected to a first power line, a control terminal connected to a reset line, and a second connection terminal;
a second reset transistor having a first connection terminal connected to the second connection terminal of the first reset transistor, a control terminal connected to the reset line, and a second connection terminal connected to a second power line;
a third transistor directly connected between the first connection terminal of the second reset transistor and the second connection terminal of the first reset transistor, wherein the third transistor has a control terminal connected to a true single-phase clock (TSPC) line; and
a fourth transistor directly connected between the first connection terminal of the second reset transistor and the second connection terminal of the first rest transistor, wherein the fourth transistor has a control terminal to which a signal according to at least one of the data input signal, a scan-enable signal, or a scan input signal is received.

19. The reset flip-flop circuit of claim 18, further comprising:
a fifth transistor having a first connection terminal connected to the first power line, a control terminal connected to a data line, and a second connection terminal.

20. The reset flip-flop circuit of claim 19, further comprising:
at least one sixth transistor having a first connection terminal connected to the second connection terminal of the fifth transistor, a control terminal connected to a scan-enable line, and a second connection terminal; and a seventh transistor having a first connection terminal connected to the second connection terminal of the at least one sixth transistor, a control terminal connected to a scan line, and a second connection terminal connected to the second power line.

* * * * *